(12) United States Patent
Tanaka et al.

(10) Patent No.: US 8,023,309 B2
(45) Date of Patent: Sep. 20, 2011

(54) SEMICONDUCTOR MEMORY DEVICE, METHOD FOR FABRICATING THE SAME AND SEMICONDUCTOR SWITCHING DEVICE

(75) Inventors: Hiroyuki Tanaka, Kyoto (JP); Yasuhiro Shimada, Kyoto (JP); Yukihiro Kaneko, Osaka (JP)

(73) Assignee: Panasonic Corporation, Osaka (JP)

( * ) Notice: Subject to any disclaimer, the term of this patent is extended or adjusted under 35 U.S.C. 154(b) by 594 days.

(21) Appl. No.: 12/209,605

(22) Filed: Sep. 12, 2008

(65) Prior Publication Data

US 2009/0097299 A1    Apr. 16, 2009

(30) Foreign Application Priority Data

Oct. 12, 2007    (JP) .................................. 2007-266919

(51) Int. Cl.
*G11C 11/22*    (2006.01)
(52) U.S. Cl. ... 365/145; 365/65; 257/295; 257/E27.104; 438/3
(58) Field of Classification Search ............... 365/49.13, 365/65, 109, 117, 145; 257/295, E21.208, 257/E21.663, E21.664, E27.104, E29.164; 438/3
See application file for complete search history.

(56) References Cited

U.S. PATENT DOCUMENTS

| 5,579,258 | A | 11/1996 | Adachi | |
|---|---|---|---|---|
| 6,744,087 | B2 | 6/2004 | Misewich et al. | |
| 6,828,189 | B2 * | 12/2004 | Igarashi | 438/239 |
| 6,930,344 | B2 * | 8/2005 | Yokozeki et al. | 257/296 |
| 2003/0235073 | A1 | 12/2003 | Fricke et al. | |
| 2004/0159874 | A1 * | 8/2004 | Tsuchiya et al. | 257/306 |
| 2004/0173830 | A1 * | 9/2004 | Yokozeki et al. | 257/296 |
| 2007/0171693 | A1 * | 7/2007 | Koyama | 365/145 |

FOREIGN PATENT DOCUMENTS

| JP | 09-116107 | 5/1997 |
|---|---|---|
| JP | 2000-156089 | 6/2000 |
| JP | 2003-282837 | 10/2003 |
| JP | 2004-031953 | 1/2004 |
| JP | 2005-317787 | 11/2005 |

* cited by examiner

*Primary Examiner* — Richard Elms
*Assistant Examiner* — Harry W Byrne
(74) *Attorney, Agent, or Firm* — McDermott Will & Emery LLP

(57) ABSTRACT

A first electrode is formed on a stacked-layer film, which is formed of a ferroelectric layer and a semiconductor layer, at the ferroelectric layer and a plurality of second electrodes are formed on the stacked-layer film at the semiconductor layer side. Each of parts of the semiconductor layer located in regions in which the second electrodes are formed functions as a resistance modulation element (memory) using the polarization assist effect of the ferroelectric layer. Information (a low resistance state or a high resistance state) held in a memory is read by detecting a value of a current flowing in each part of the semiconductor layer. Information is written in a memory by inverting a polarization of the ferroelectric layer.

23 Claims, 22 Drawing Sheets

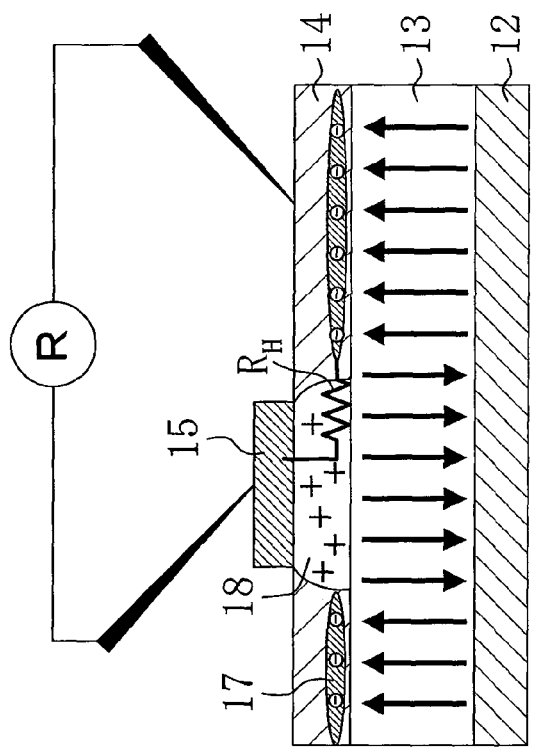
FIG. 4A
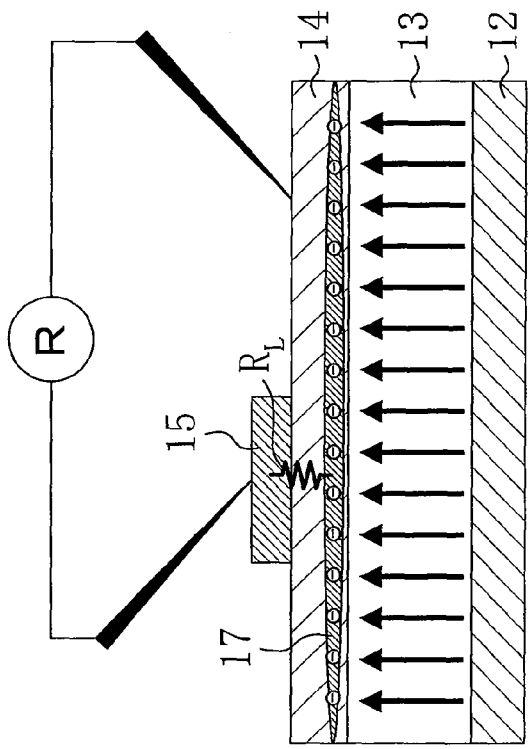
FIG. 4B
| Resistance value between semiconductor layer and second electrode (conduction state) | Low resistance (short-circuited) ($R_L < 10^3$ ohm per square) | High resistance (open-circuited) ($R_H > 10^6$ ohm per square) |
|---|---|---|
| | (a) | (b) |
| Holding state | First state | Second state |
FIG. 4C

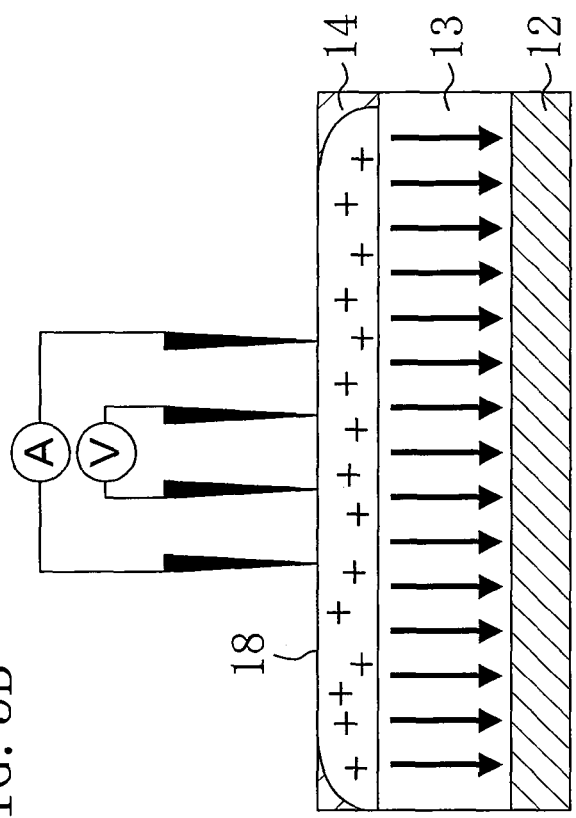
FIG. 5A
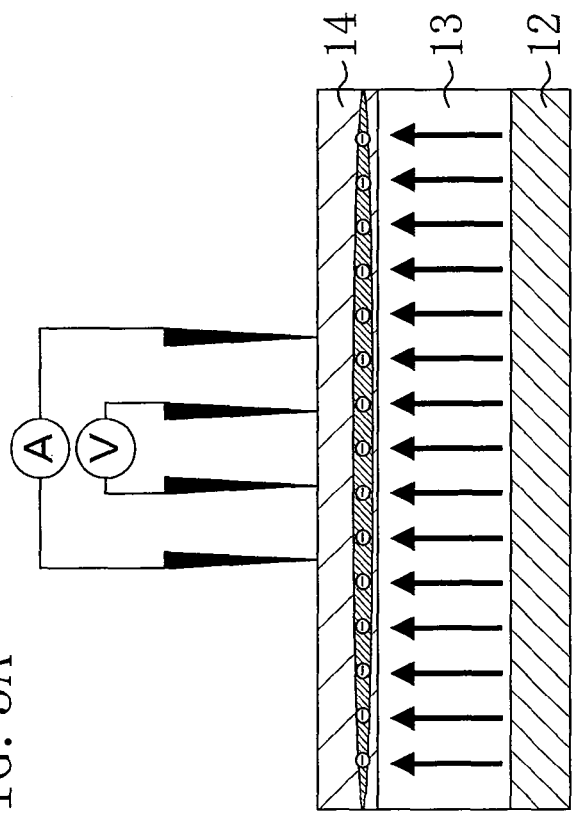
FIG. 5B
FIG. 5C
| Sheet resistance of semiconductor layer (ohm per square) | Two-dimensional electrons are accumulated | Two-dimensional electrons are excluded |
|---|---|---|
| | $<1\times10^3$ | $>1\times10^6$ |

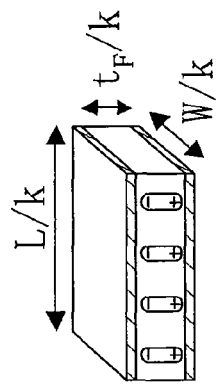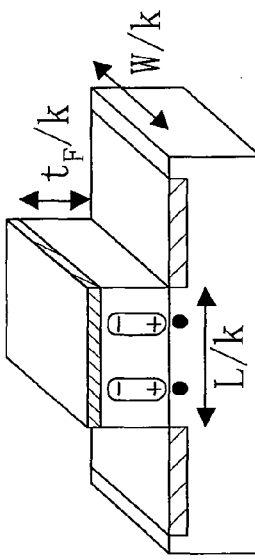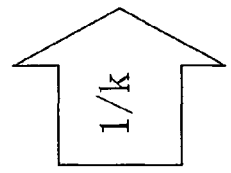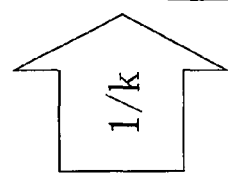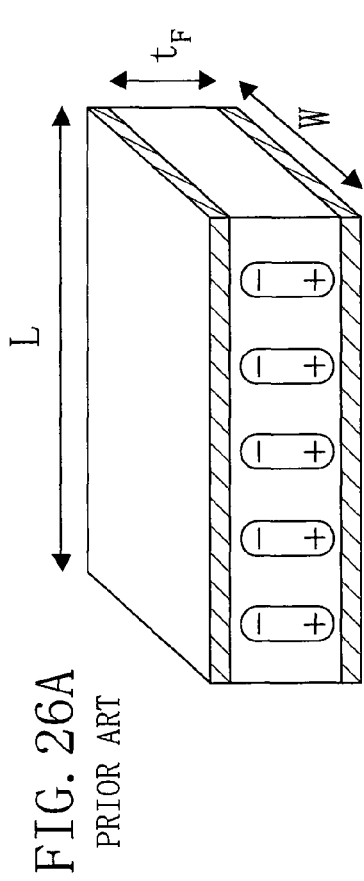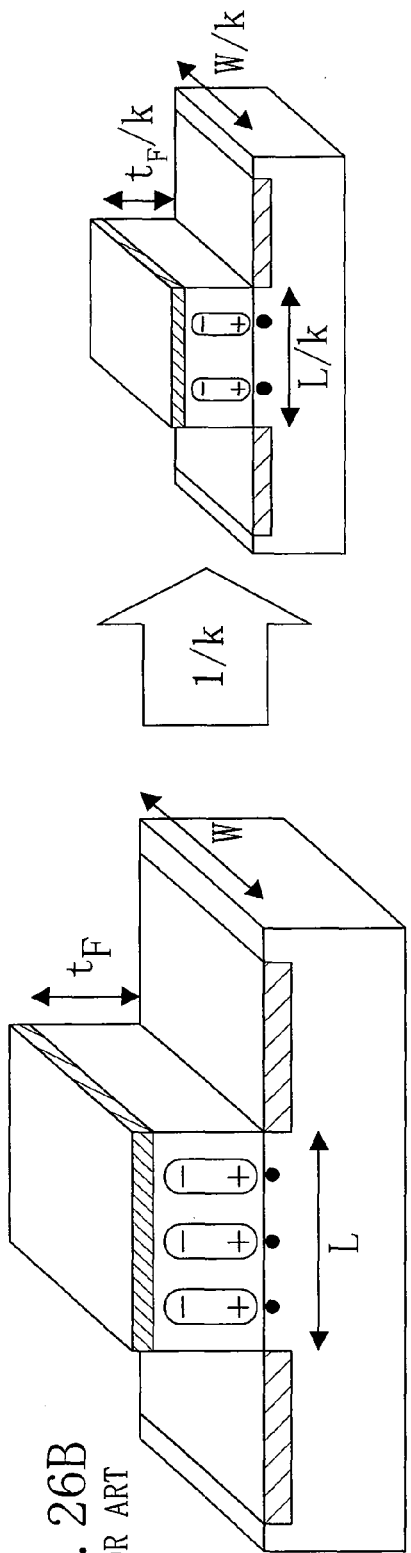
FIG. 26A
PRIOR ART
FIG. 26B
PRIOR ART

SEMICONDUCTOR MEMORY DEVICE, METHOD FOR FABRICATING THE SAME AND SEMICONDUCTOR SWITCHING DEVICE

BACKGROUND OF THE INVENTION

1. Field of the Invention

The present invention relates to a nonvolatile semiconductor memory device which allows increase in degree of integration and capacity and a method for fabricating the nonvolatile semiconductor memory device, and also relates to a semiconductor switching device.

2. Description of the Prior Art

A ferroelectric memory (FeRAM), which is one of nonvolatile memories, uses a polarization hysteresis of a ferroelectric material for memory retaining. In such a ferroelectric memory, inversion of polarization can be repeated for many times at low voltage and high speed, and thus a ferroelectric memory is considered excellent, compared to a flash memory, in the point that it can be operated with low power consumption, at high speed and with high reliability.

There are largely two types of ferroelectric memories: a capacitor type shown in FIG. 26A (see, for example, Japanese Laid-Open Publication No. 9-116107 and Japanese Laid-Open Publication No. 2000-156089); and an FET (Field Effect Transistor) type having a structure in which a gate insulation film of a metal-oxide-semiconductor (MOS) transistor shown in FIG. 26B is replaced with a ferroelectric film (see, for example, U.S. Pat. No. 6,744,087).

A capacitor type ferroelectric memory has a similar structure to that of a dynamic random access memory (DRAM) in which charges are held in a ferroelectric capacitor and a state of information is judged to be 0 or 1 according to the polarization direction of a ferroelectric material.

With this structure, as shown in FIG. 27A, when capacitors serving as function units are connected to one another at each cross point and thereby are formed into array type elements, a memory size can be reduced to $4F^2$ in terms of design rule. Herein, F is a size according to a fine design rule. A relative occupied area can be indicated using F.

However, practically, a capacitor type ferroelectric memory is not suitable for reduction in size because when a capacitor area is reduced, the amount of charges ($\Delta Q$) that can be held therein is reduced and, as shown in FIG. 27B, finally becomes lower than a limit level (about 100 fC) for reading by a sense amplifier. Thus, it becomes difficult to judge a state of information to be 0 or 1. The amount of a remnant polarization (Pr) for a typical ferroelectric material is about 10-50 μC/cm at best. Thus, when a CMOS process is reduced and a gate length of a MOS transistor becomes a process node of 0.1 μm or less, a practical minimum cell size is about $20 F^2$ at best.

On the other hand, in a FET type ferroelectric memory, information is read by detecting a conduction state of a channel, which varies depending on a polarization direction of a ferroelectric layer. To satisfy the scaling law, only a small amount of polarization charges per unit area is required. Therefore, a FET type ferroelectric memory is suitable for reduction in size, compared to a capacitor type memory.

However, when a FET type memory is operated as a memory, an arbitrary memory cell has to be selected from memory cells arranged in arrays in the FET type memory and thus a switching transistor for selecting a memory cell is needed. Even though a structure (stacking structure) in which a transistor for memory cell selection and a ferroelectric transistor for memory retaining are stacked is adopted to reduce the size of memory cells, a minimum size of the ferroelectric transistor with the selection transistor is about 12 $F^2$ at best and is still larger than an ideal size, i.e., $4 F^2$ for a ferroelectric memory with a reduced size.

As described above, a ferroelectric memory exhibits excellent properties such as low power consumption, high speed operation and high reliability, and at the same time it has a problem that it is difficult to reduce its size. For this reason, a memory capacity of only megabits at largest has been achieved by now. Therefore, in actual cases, application of ferroelectric memories is limited to an IC tag, a smart card and the like.

On the other hand, a flash memory can be fabricated to have a minimum cell size of $4F^2$ and thus a capacity of gigabits has been achieved. Therefore, flash memories have been widely used for large capacity application such as a picture card for digital cameras, USB memory sticks and the like.

In recent years, more and more nonvolatile memories using resistance modulation are under research and development. A resistance modulation element reads resistance change and is scalable, and thus reduction in size of a memory device can be expected. Examples of such nonvolatile memories are a magnetic memory (MRAM; Magnetoresistive Random Access Memory) using change in magnetic resistance according to a direction of spinning of a magnetic body (see, for example, Japanese Laid-Open Publication No. 2003-282837), a resistance change memory (ReRAM; Resistive Random Access Memory) using the colossal electro-resistance (CER) effect of a strongly-correlated material (see, for example, Japanese Laid-Open Publication No. 2005-317787), a phase change memory (PRAM; Phase Change Random Access Memory) using resistance change according to phase transition of chalcogenide compound (see, for example, Japanese-Laid-Open Publication No. 2004-031953) and the like. If array type elements are formed so as to be connected to one another at each cross point, as shown in FIG. 27A, using a resistance change layer as a function unit, a constant resistance change ($\Delta R = RH/RL$), which is not dependent on a cell area, is achieved, and thus a minimum cell size of $4F^2$ can be realized.

SUMMARY OF THE INVENTION

As has been described, a nonvolatile memory using resistance modulation is suitable for reduction in size of a memory device. However, a MRAM exhibits an excellent rewrite resistance and, at the same time, it has a problem that a write current density is large. Also, the mechanism of a ReRAM has not been yet clearly identified. A PRAM also has a problem that a write current density is large. As described above, nonvolatile memories such as a MRAM and the like have problems in power consumption, operation speed, reliability and the like and, thus, their application to a large capacity memory of gigabits has not been realized.

In a ferroelectric memory, if the size of a memory cell can be reduced to $4F^2$ and as large capacity as that of a flash memory can be realized, all problems in power consumption, operation speed, reliability and the like might be solved together.

In view of the above-described points, the present invention has been devised and it is therefore an objective of the present invention to provide a semiconductor memory device having a novel structure which allows reduction in cell size to $4F^2$ and is suitable for application to a high-speed, large capacity memory with low power consumption.

To achieve the above-described object, a semiconductor memory device according to the present invention includes a stacked-layer film of a ferroelectric layer and a semiconductor layer and thereby modulating a resistance of the semiconductor layer according to the orientation of a polarization of the ferroelectric layer to write/read the two modulated resistance states in/from the semiconductor layer.

Specifically, the semiconductor memory device of the present invention is characterized in that the semiconductor memory device includes: a stacked-layer film formed of a ferroelectric layer and a semiconductor layer; a first electrode formed on the ferroelectric layer of the stacked-layer film; and a plurality of second electrodes formed on the semiconductor layer of the stacked-layer film, each of parts (A) of the semiconductor layer located in regions in which the second electrodes are formed, respectively, holds one of a first state in which majority carriers in the semiconductor layer are coupled with polarization charges in the ferroelectric layer and thereby a low resistance state is achieved, and a second state in which minority carriers in the semiconductor layer are coupled with polarization charges in the ferroelectric layer and thereby a high resistance state is achieved, and part (B) of the semiconductor layer located in a region other than the regions in which the second electrodes are formed, respectively, holds a low resistance state in which majority carriers in the semiconductor layer are coupled with polarization charges in the ferroelectric layer.

In this case, a value of a current flowing between each of the part (B) of the semiconductor layer and each of the second electrodes is detected, thereby reading the first state or the second state held in each of the parts (A) of the semiconductor layer.

A voltage is applied between the first electrode and each of the second electrodes to invert a polarization of part of the ferroelectric layer located in a region in which the second electrode is formed, thereby writing the first state or the second state in an associated one of the parts (A) of the semiconductor layer.

With the above-described structure, each of the parts (A) of the semiconductor layer located in regions in which the second electrodes are formed, respectively, functions as a memory element for holding one of resistance states having different resistance values. Accordingly, information (a low resistance state or a high resistance state) held in a memory element can be read by detecting a value of a current flowing in each of the parts (A) of the semiconductor layer, and information can be written in the semiconductor element by inverting a polarization of the ferroelectric layer.

Part (B) of the semiconductor layer located in a region other than the regions in which the second electrodes are formed, i.e., memory elements are provided is in a low resistance state due to coupling of majority carriers in the semiconductor layer with polarization in the ferroelectric layer. Once a low resistance state is achieved, the polarization of the ferroelectric layer is held semipermanently, and therefore the part (B) of the semiconductor layer can be considered to be an electrode. Thus, information held in one of the memory cells can be read by detecting a value of a current flowing between the part of the semiconductor layer and each of the second electrodes.

In one preferred embodiment of the present invention, the stacked-layer film is provided plural in number so that each of the stacked-layer films has a strip shape and is arranged on a substrate so as to extend along a column direction, the second electrodes formed on the semiconductor layer of each of the stacked-layer films are connected to a plurality of interconnects which are arranged on the substrate so as to extend along a row direction, and the parts (A) of the semiconductor layers each of which is located at a region in which each of the semiconductor layers intersects with an associated one of the interconnects function as memory cells arranged in arrays.

In this case, the plurality of semiconductor layers arranged so as to extend along the column direction form column interconnects, the plurality of interconnects arranged so as to extend along the row direction form row interconnects, and a value of a current flowing between selected one as a read column interconnect from the plurality of interconnects and selected one from the row interconnects is detected, thereby reading the first state or the second state held in one of the memory cells located in a region in which the selected read column interconnect intersects with the selected row interconnect.

Also, the first electrode formed on the ferroelectric layer is provided plural in number so that each of the first electrodes has a strip shape, and the first electrodes form write column interconnects which are arranged on the substrate so as to extend along a column direction, and a voltage is applied between selected one of the write column interconnects and the selected row interconnect to invert a polarization of part of the ferroelectric layer located in a region in which the selected write column interconnect intersects with the selected row interconnect, thereby writing the first state or the second state in said one of the memory cells.

In the above-described structure, the parts (A) of the semiconductor layer functioning as memory elements are arranged in arrays, thereby realizing array type memory cells connected with one another at each cross point. That is, cross-point connection of memory cells can be achieved in regions in which read column interconnects each being formed of the semiconductor layer (or write column interconnects each being formed of the first electrode) intersect with the row interconnects connected to the second electrodes, respectively.

In a semiconductor memory device according to the present invention, resistance modulation elements using the polarization assist effect of a ferroelectric material are used as memory elements and are arranged in arrays, so that a structure of cross-point connection of memory cells is realized. This allows reduction in cell size to 4 $F^2$, which can not be realized by a known structure, and a semiconductor memory device suitable for a large capacity memory capable of high-speed operation with low power consumption can be achieved.

BRIEF DESCRIPTION OF THE DRAWINGS

FIG. 4A is a cross-sectional view of a semiconductor layer according to the present invention when it is in a low resistance state, FIG. 4B is a cross-sectional view of the semiconductor layer when it is in a high resistance state, and FIG. 4C is a table showing resistance values between the semiconductor layer and a second electrode.

FIG. 5A is a diagram illustrating how a resistance value of the semiconductor layer of the present invention is measured when it is in a low resistance state where two-dimensional electrons are accumulated, FIG. 5B is a diagram illustrating how the resistance value of the semiconductor layer is measured when it is in a high resistance state where two-dimensional electrons are excluded, and FIG. 5C is a table showing respective measurement results.

FIG. 26A is an illustration of a structure of a known capacitor type ferroelectric memory, and FIG. 26B is an illustration of a structure of a known FET type ferroelectric memory.

DESCRIPTION OF THE PREFERRED EMBODIMENTS

Figure 1:
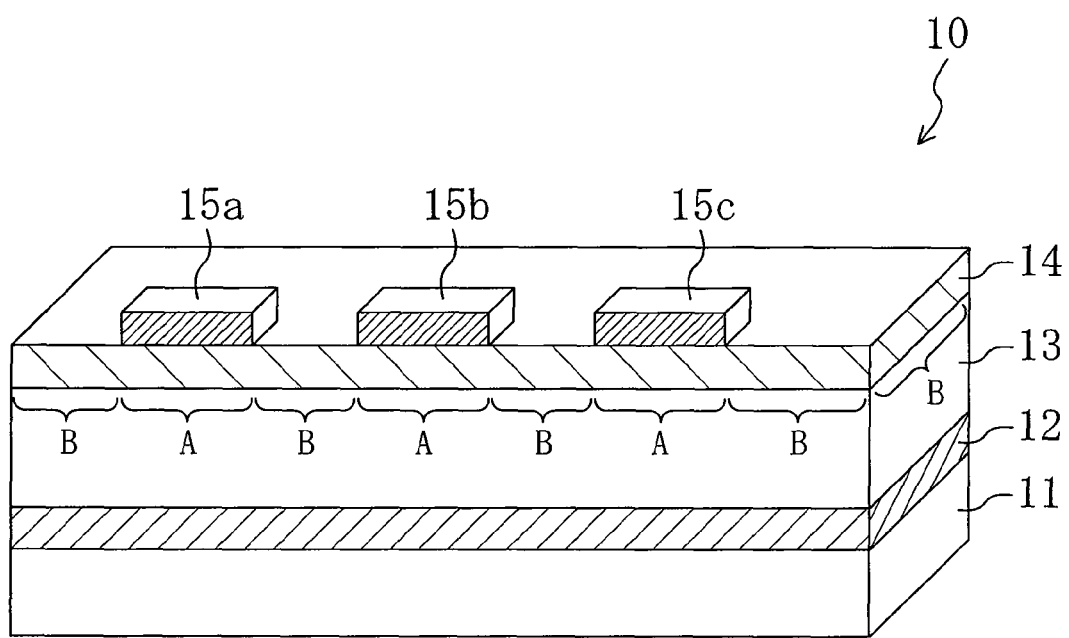
FIG. 1 is a cross-sectional perspective view schematically illustrating a structure of a semiconductor memory device according to the present invention.

Hereafter, embodiments of the present invention will be described with reference to the accompanying drawings. In the drawings, components having substantially the same function are denoted by the same reference numeral for the purpose of simplicity. Note that the present invention is not limited to the following embodiments.

FIG. 1 is a cross-sectional perspective view schematically illustrating a structure of a semiconductor memory device according to an embodiment of the present invention.

As shown in FIG. 1, a semiconductor memory device 10 according to the present invention includes a stacked layer of a ferroelectric layer 13 and a semiconductor layer 14. In the semiconductor memory device 10, a first electrode 12 is formed on the stacking layer at the ferroelectric layer 13 side and a plurality of second electrodes 15a, 15b and 15c are formed on the stacked layer at the semiconductor layer 14 side. These layers are formed on a substrate 11.

In each of parts (A) of the semiconductor layer 14 located in regions in which the second electrodes 15a, 15b and 15c are formed, either of a first state where majority carriers in the semiconductor layer 14 are coupled with polarization charges in the ferroelectric layer 13 and a low resistance state is achieved or a second state where minority carriers in the semiconductor layer 14 are coupled with polarization in the ferroelectric layer 13 and a high resistance state is achieved is maintained.

In part (B) of the semiconductor layer 14 located in a region other than the regions in which the second electrodes 15a, 15b and 15c are formed, majority carriers in the semiconductor layer 14 are coupled with polarization charges in the ferroelectric layer 13 and a low resistance state is maintained.

In the semiconductor memory device 10 having the above-described structure, each of the parts (A) of the semiconductor layer 14 located in regions in which the second electrodes 15a, 15b and 15c are formed functions as a memory element for holding one of resistance states having different resistance values. By detecting a value of a current flowing between the part (B) of the semiconductor layer 14 and an associated one of the second electrodes 15a, 15b and 15c, the first state or the second state held by each of the parts (A) of the semiconductor layer 14 is read. Moreover, a voltage is applied between the first electrode 12 and each of the second electrodes 15a, 15b and 15c to invert a polarization in each of parts of the ferroelectric layer 13 located in regions in which the second electrodes 15a, 15b and 15c are formed, respectively, thereby writing the first state or the second state on each of the parts (A) of the semiconductor layer 14.

Hereafter, the basic operation of the semiconductor memory device of the present invention will be described with reference to the drawings.

Figure 2A:
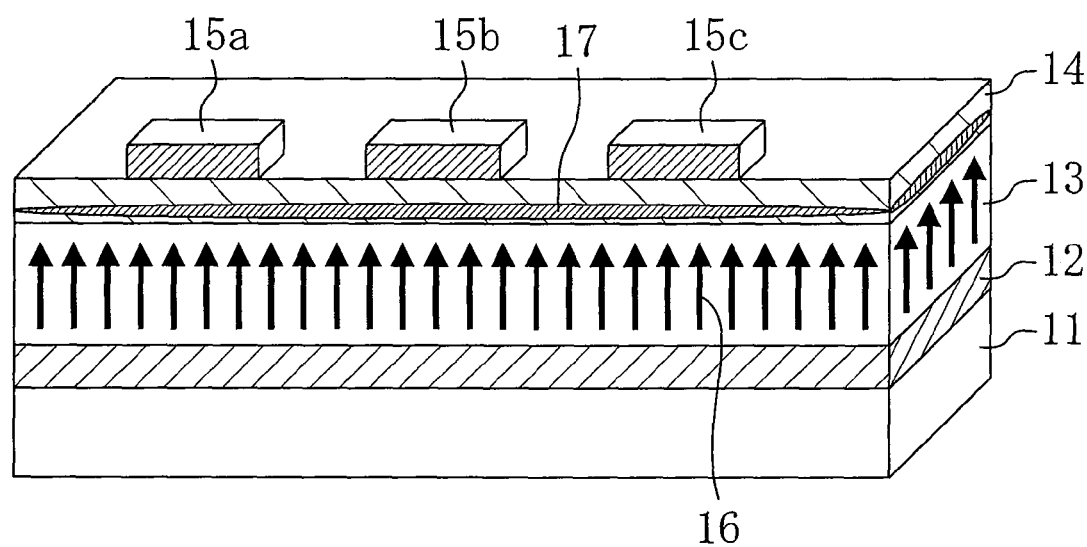
FIG. 2A is a cross-sectional perspective view illustrating an initial state of the semiconductor memory device of the present invention.
Figure 2B:
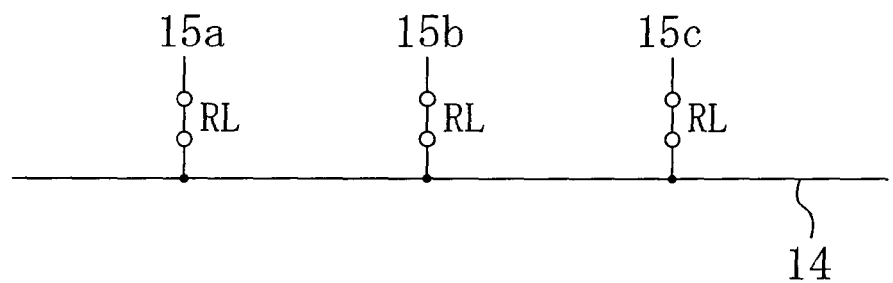
FIG. 2B is an equivalent circuit diagram of the semiconductor memory device.

FIGS. 2A and 2B show an initial state of the semiconductor memory device. FIG. 2A is a cross-sectional perspective view and FIG. 2B is an equivalent circuit diagram.

For example, when an n-type semiconductor material is used for the semiconductor layer 14, all polarizations 16 are oriented in the same direction so that the polarizations 16 of the ferroelectric layer 13 are coupled with electrons (majority carriers) of the semiconductor layer 14 in an initial state. In this case, two-dimensional electrons 17 induced by polarization in the ferroelectric layer 13 are accumulated around an interface between the semiconductor layer 14 and the ferroelectric layer 13, and the semiconductor layer 14 is in a low resistance state. Thus, the semiconductor layer 14 serves as a channel in which electricity flows in the same manner as a metal electrode and can be used as the same kind of electrode as a metal electrode. In such a case, as shown in FIG. 2B, a conduction state between the semiconductor layer 14 and each of the second electrodes 15a, 15b and 15c is short-circuited.

Figure 3A:
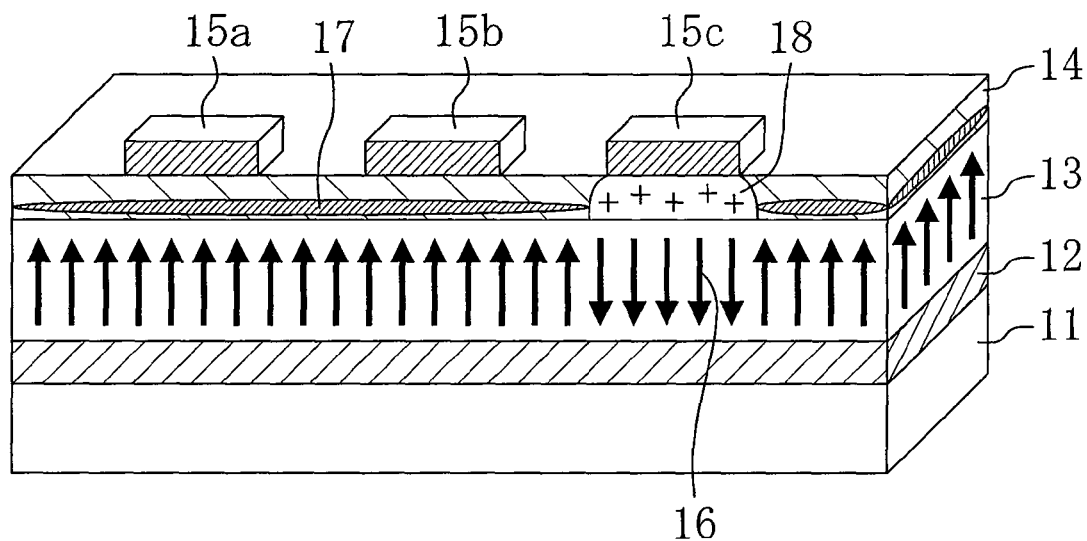
FIG. 3A is a cross-sectional perspective view illustrating the operation of the semiconductor memory device of the present invention.
Figure 3B:
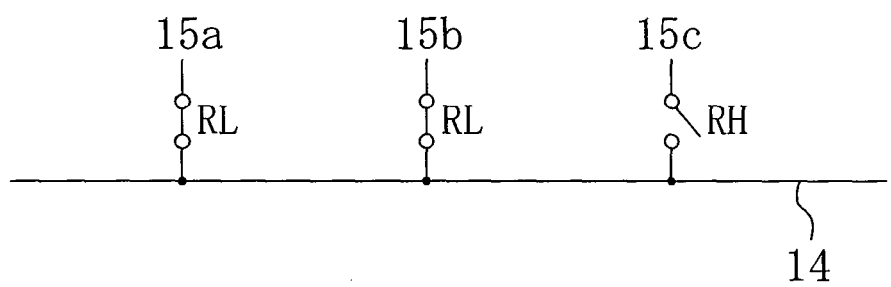
FIG. 3B is an equivalent circuit diagram of the semiconductor memory device.

In this state, as shown in FIG. 3A, when a bias voltage relative to the first electrode 12 is applied to the second electrode 15c to invert only the polarization in part of the ferroelectric layer 13 located in which the second electrode 15c is formed, the polarization is oriented in a direction which causes exclusion of electrons in the semiconductor layer 14. Accordingly, only the part (A) of the semiconductor layer 14 located in the region in which the second electrode 15c is formed is depleted and thus becomes in a high resistance state. As a result, as shown in FIG. 3B, a state between the semiconductor layer 14 and the second electrode 15c is an open-circuited state.

FIGS. 4A, 4B and 4C show two resistance states of part of the semiconductor layer 14 located in a region in which a second electrode 15 is formed. FIG. 4A is a cross-sectional view of the part when it is in a low resistance state, FIG. 4B is a cross-sectional view of the part when it is in a high resistance state, and FIG. 4C is a table showing sheet resistance values between the semiconductor layer 14 and the second electrode 15. As shown in the table, each of the parts (A) of the semiconductor layer 14 located in regions in which the second electrodes 15a, 15b and 15c are formed can be in either of two states having different sheet resistance values because of the polarization assist effect of the ferroelectric layer 13.

In the state shown in FIG. 4B, a low bias voltage relative to the first electrode 12 is applied to the second electrode 15 to invert again the polarization of the ferroelectric layer 13. Thus, the polarization is oriented in the direction in which electrons are accumulated and the part (A) of the semiconductor layer 14 located in the region in which the second electrode 15 is formed is back to a low resistance state. As a result, the conduction state between the semiconductor layer 14 and the second electrode 15 becomes in a short circuit state again.

FIGS. 5A, 5B and 5C show results of measurement for resistance values of the semiconductor layer 14 using a four-probe method. FIG. 5A is a diagram illustrating how the resistance value of the semiconductor layer 14 is measured when it is in a low resistance state where two-dimensional electrons are accumulated, FIG. 5B is a diagram illustrating how the resistance value of the semiconductor layer 14 is measured when it is in a high resistance state where two-dimensional electrons are excluded, and FIG. 5C is a table showing respective measurement results. As shown in the table of FIG. 5C, the resistance value of the semiconductor layer 14 is about $1 \times 10^3$ ohm per square or less in a low resistance state and about $1 \times 10^5$ ohm per square or more in a high resistance state.

As has been described, using the polarization assist effect of the ferroelectric layer 13, resistance modulation between the semiconductor layer 14 and an arbitrary second electrode 15 becomes possible and, furthermore, a constant polarization state of the ferroelectric layer 13 is maintained. Thus, the part of the semiconductor layer 14 located in a region in which the second electrodes 15 is formed can be made to function as a memory holding two conduction states, i.e., information 0 and 1. Then, the information held by each of the parts can be read by detecting a value of a current flowing between the semiconductor layer 14 and an arbitrary second electrode 15. Thus, a semiconductor device having the above-described structure can be used as a memory.

The part (A) of the semiconductor layer 14 located in the region in which the second electrode 15 is formed has a relatively low electrical resistance when majority carriers in the semiconductor layer 14 are of a polarity that attracts polarization induced at an interface with the ferroelectric layer 13, and has a relatively high electrical resistance when the carriers are of a polarity that repels the polarization. With the carriers in the semiconductor layer 14 coupled with polarization charges in the ferroelectric layer 13, a state of the electrical resistance of the semiconductor layer 14 is maintained and the effect as a memory is generated.

When majority carriers in the semiconductor layer 14 attract polarization charges in the ferroelectric layer 13, high-density charges are accumulated around the interface between the semiconductor layer 14 and the ferroelectric layer 13. The charges are held there and thus are also considered as two-dimensional electron gas induced at the interface. The semiconductor layer 14 becomes in a low resistance state due to the two-dimensional electron gas and serves as a metal. Therefore, the semiconductor layer 14 can be considered as part of an electrode. Moreover, a distribution where the amount of two-dimensional electrons decreases in the thickness direction of the semiconductor layer 14 is likely to be obtained and thus the depolarization electric field hardly functions. Accordingly, a state where the two-dimensional electron gas is induced can be maintained for a long time.

When majority carriers in the semiconductor layer 14 are of a polarity that repels polarization charges, only carriers accumulated around the interface between the semiconductor layer 14 and the ferroelectric layer 13 are excluded and minority carriers are coupled with polarization. In such a state, the part (A) of the semiconductor layer 14 located in the region in which the second electrode 15 is formed has a high resistance and connection with other part of the semiconductor layer 14 which surrounds the part (A) and is in a low resistance state is cut off. This state is stably maintained.

The number of majority carriers contained in the semiconductor layer 14 per unit area is preferably smaller than the number of polarization charges induced and contained at the interface with the ferroelectric layer 13 per unit area. In this case, when majority carriers are of a polarity that repels polarization charges, the semiconductor layer 14 can be completely depleted and a high resistance state is realized. Thus, a larger ratio between respective resistance values in a low resistance state and a high resistance state can be achieved.

Note that the description above has been made for understanding of the basic operation of the semiconductor memory device of the present invention in principle, but not for the purpose of exactly explaining the physical phenomenon.

Therefore, it is assumed that the above-described phenomenon might vary in a certain range due to various external factors.

In the description above, the semiconductor layer 14 is formed of an n-type semiconductor material. However, even when a p-type semiconductor material used for the semiconductor layer 14, a resistance modulation operation can be performed in the same manner by applying a reverse bias of a bias applied to the n-type semiconductor material in the above-described case.

As shown in FIGS. 2A and 2B, as a method for making the semiconductor layer 14 serve as a metal electrode by setting orientations of polarizations in the ferroelectric layer 13 to be all the same in an initial state, for example, the following method can be used.

Figure 6:
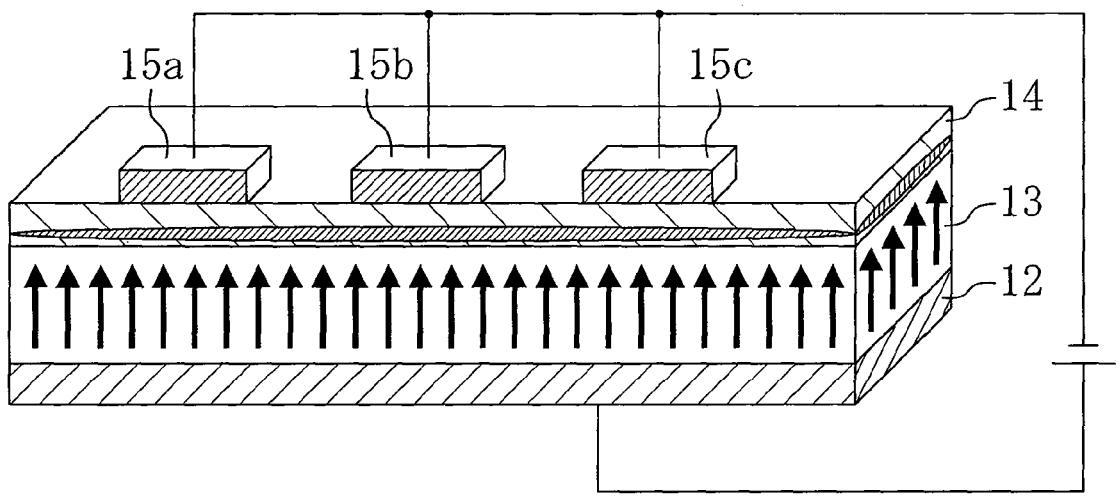
FIG. 6 is a cross-sectional perspective view illustrating a method for setting the semiconductor layer of the present invention to be in an initial state.

As shown in FIG. 6, a low bias voltage relative to the first electrode 12 is applied to all or part of the second electrodes 15a, 15b and 15c. Thus, although charges to be coupled with polarization charges in the ferroelectric layer 13 are induced in the semiconductor layer 14, part of the semiconductor layer 14 in which charges are induced spreads in a positive feedback direction and polarizations can be oriented in the same direction not only in the parts of the ferroelectric layer 13 located in the regions in which the second electrodes 15a, 15b and 15c are formed but in the entire ferroelectric layer 13.

Figure 7A:
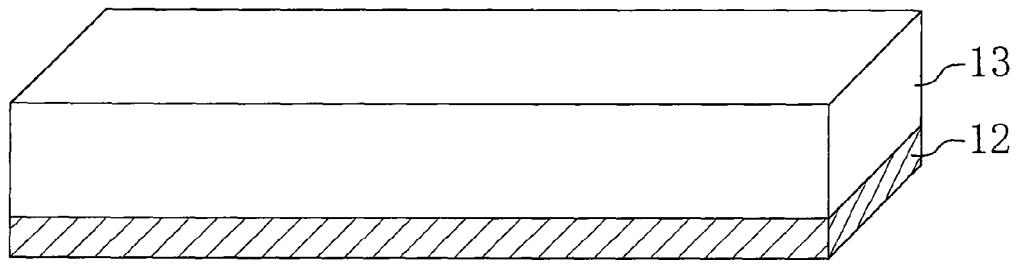
FIGS. 7A through 7C are cross-sectional perspective views illustrating steps of the method for setting the semiconductor layer of the present invention to be in an initial state.
Figure 7B:
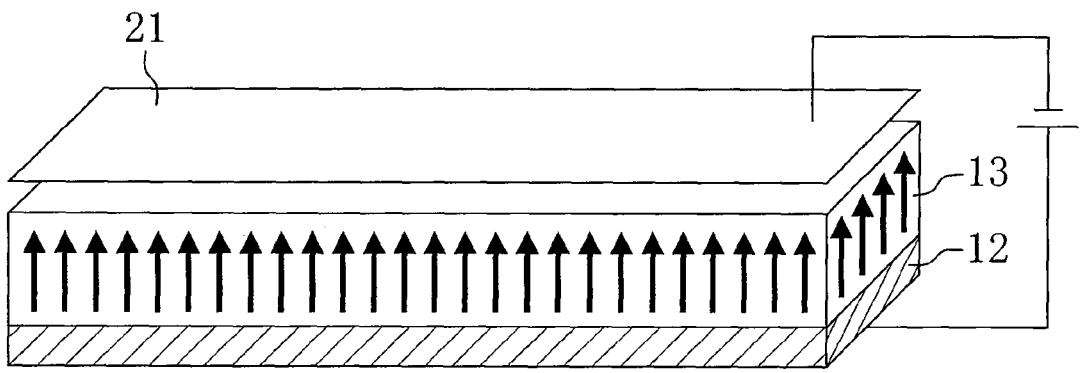
Figure 7C:
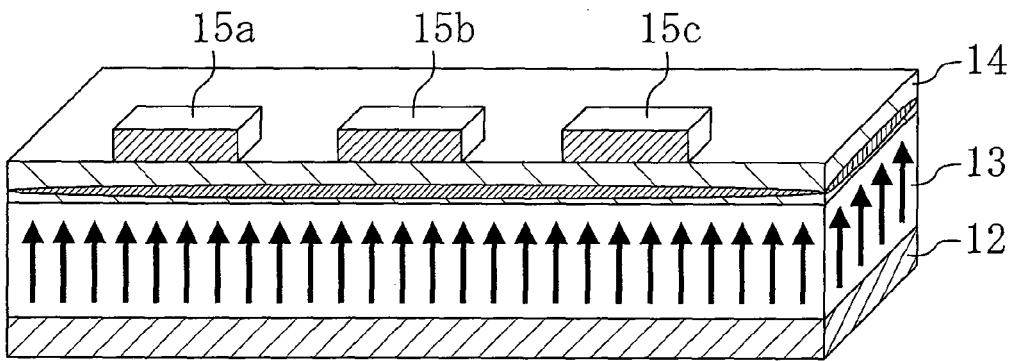

As shown in FIG. 7A, the ferroelectric layer 13 is heated to a temperature equal to or higher than the Curie point (Tc) of a material of the ferroelectric layer 13 to eliminate polarizations in the ferroelectric layer 13, and then, as shown in FIG. 7B, the temperature of the ferroelectric layer 13 is reduced to a temperature equal to or lower than the Curie point while an electric field is applied in a certain direction. By this method, polarizations can be oriented in the same direction in the entire ferroelectric layer 13. Thereafter, as shown in FIG. 7C, a semiconductor layer 14 is formed on the ferroelectric layer 13 and then a plurality of second electrodes 15a, 15b and 15c are formed thereon. The step shown in FIG. 7B may be performed after the semiconductor layer 14 is formed on the ferroelectric layer 13 and the second electrodes 15a, 15b and 15c are formed thereon.

Figure 8:
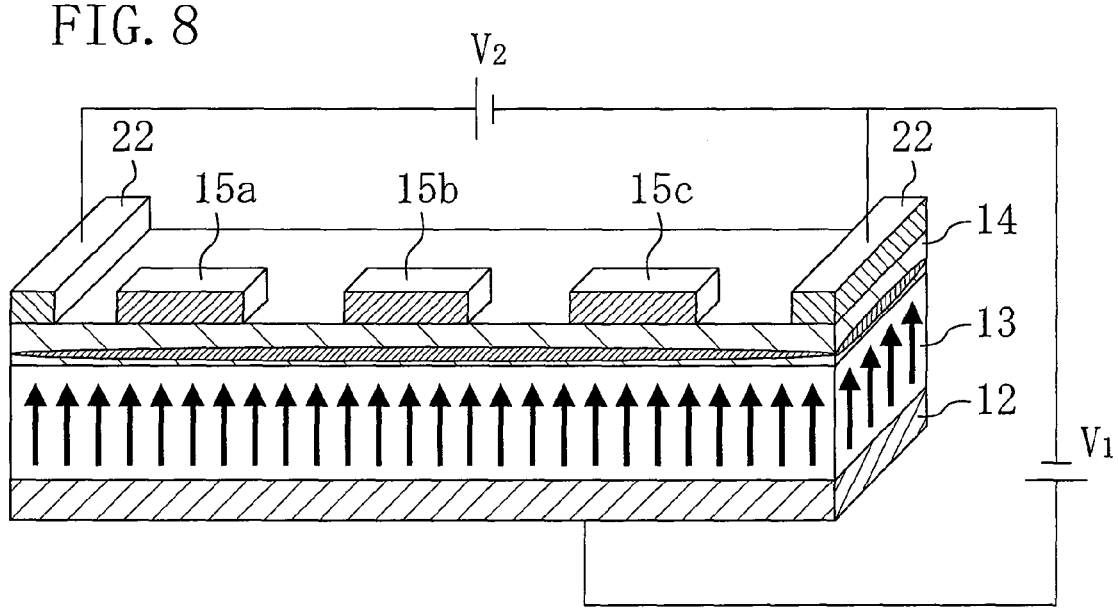
FIG. 8 is a cross-sectional perspective view illustrating a method for setting the semiconductor layer of the present invention to be in an initial state.

As another alternative, as shown in FIG. 8, electrodes 22 are arranged at both end portions of the semiconductor layer 14, respectively, and a proper potential gradient $V_2$ is generated between the electrodes 22. With this state held, a potential $V_1$ of the first electrode 12 is sufficiently increased ($V_1 \ll V_2$) to form a channel throughout the semiconductor layer 14. Thus, polarization direction can be aligned in the same direction in the entire ferroelectric layer 13 by coupling channel charges with polarizations throughout the ferroelectric layer 13.

Next, the arrangement of the second electrodes in the semiconductor memory device of the present invention will be described with reference to FIGS. 9A and 9B, FIGS. 10A and 10B and FIGS. 11A and 11B.

As shown in FIG. 1, the semiconductor layer 14 in the semiconductor memory device of the present invention is formed to have a strip shape, and the plurality of the second electrodes 15a, 15b and 15c are arranged along a longitudinal direction. The semiconductor layer 14 has a wider width than that of each of the second electrodes 15a, 15b and 15c. This is for the purpose of making part (B) (maintaining a low resistance at an initial state) of the semiconductor layer 14 located in a region other than the regions in which the second electrodes 15a, 15b and 15c are formed function as an electrode to ensure a current path, without depending on a resistance state of the parts (A) (functioning as a memory element) of the semiconductor layer 14 located in the regions in which the second electrodes 15a, 15b and 15c are formed.

Figure 9A:
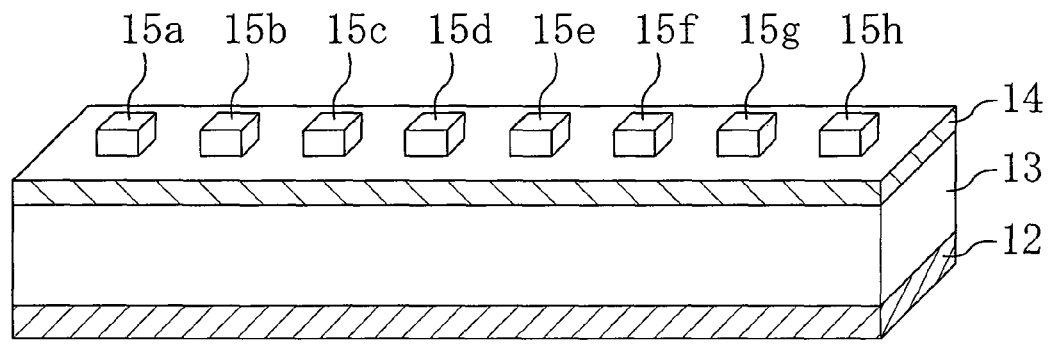
FIG. 9A is a cross-sectional perspective view illustrating an exemplary arrangement of second electrodes according to the present invention.
Figure 9B:
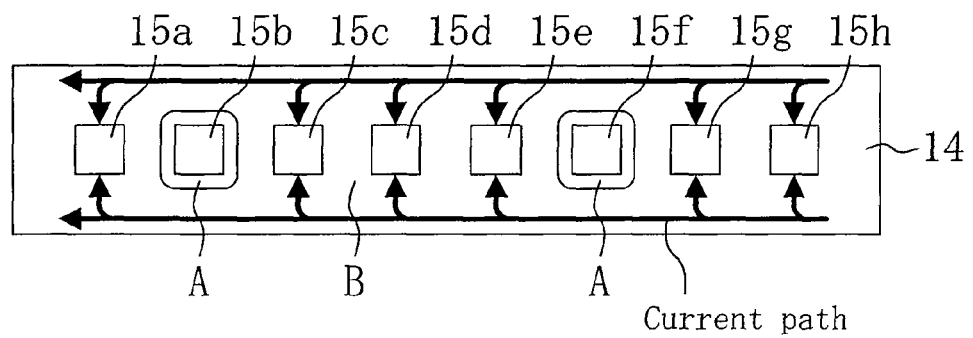
FIG. 9B is a plan view of the arrangement.

FIGS. 9A and 9B are views illustrating an exemplary arrangement of the second electrodes 15. FIG. 9A is a cross-sectional perspective view. FIG. 9B is a plan view. The second electrodes 15a through 15h are arranged along an approximately center line of the strip shape semiconductor layer 14 at regular intervals. As shown in FIG. 9B, for example, even when parts (A) of the semiconductor layer 14 located in regions in which the second electrodes 15b and 15f are formed, respectively, are in a high resistance state (for example, in a depletion state), part (B) of the semiconductor layer 14 located in a region other than the regions in which the second electrodes 15a through 15h are formed is in a low resistance state, so that a current path is ensured and the entire semiconductor layer 14 can function as an electrode.

Figure 10A:
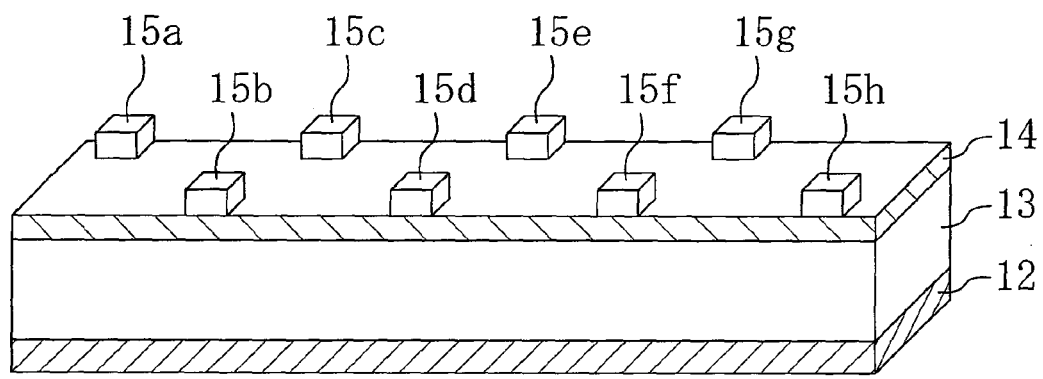
FIG. 10A is a cross-sectional perspective view illustrating another arrangement of the second electrodes according to the present invention.
Figure 10B:
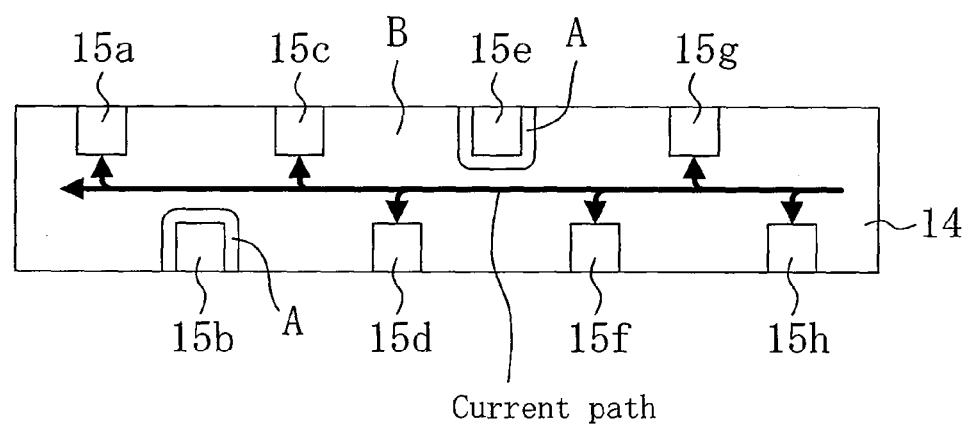
FIG. 10B is a plan view of the arrangement.

As another alternative, as shown in FIGS. 10A and 10B, the second electrodes 15a through 15h may be arranged staggered in relation to one another across the center line of the semiconductor layer 14.

Figure 11A:
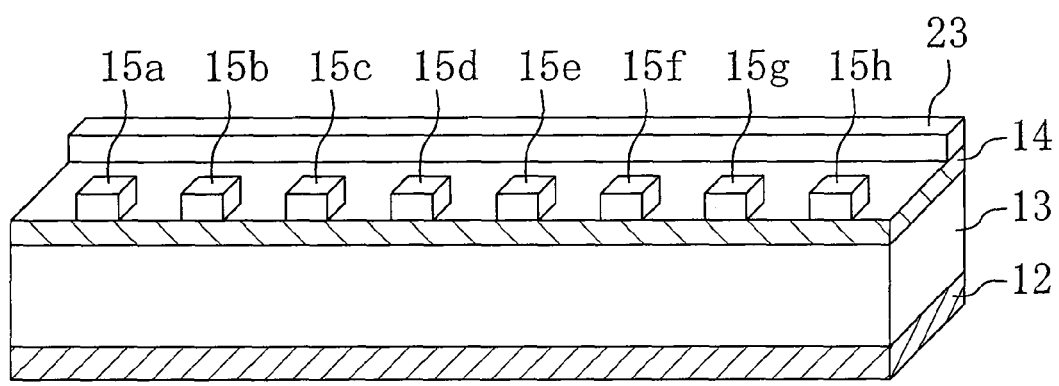
FIG. 11A is a cross-sectional perspective view illustrating still another arrangement of the second electrodes according to the present invention.
Figure 11B:
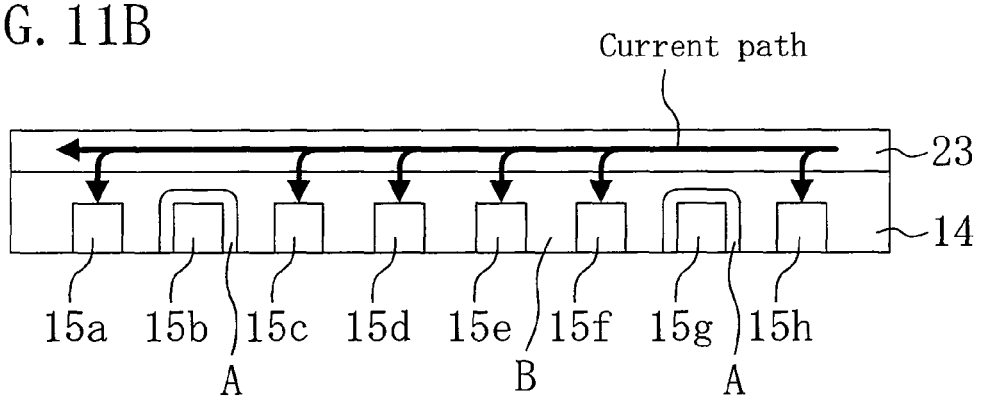
FIG. 11B is a plan view of the arrangement.

Furthermore, when the resistance of the semiconductor layer 14 is not low enough and the electrode has a large length, a current which can be made to flow in the semiconductor layer 14 is limited and, accordingly, only poor response is made when a current flows at high speed. In such a case, as shown in FIGS. 11A and 11B, the second electrodes 15a through 15h may be arranged along an edge of the semiconductor layer 14 and assist electrodes 23 may be formed along an edge on the opposite side to ensure a current path.

Next, the case where the semiconductor memory device of the present invention is used as an array cross-point type memory will be described with reference to FIG. 12 and FIG. 13.

Figure 12:
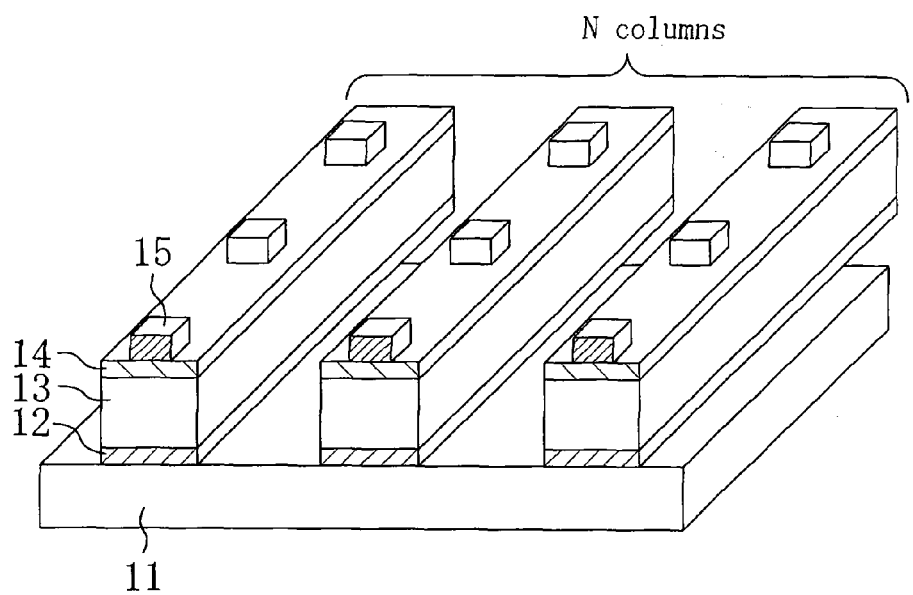
FIG. 12 is a cross-sectional perspective view illustrating an arrangement for a cross-point type memory according to the present invention.

First, as shown in FIG. 12, a plurality of stacked layers of a ferroelectric layer 13 and a semiconductor layer 14 are formed on a substrate 11 so that each of the stacked layers has a strip shape. The strip shape stacked layers (N columns) are arranged so that each of the stacked layers extends along a column direction. In this case, a first electrode 12 is formed on each of the stacked layers at the ferroelectric layer 13 side so as to have a strip shape. For example, the stacked layers can be formed by forming the first electrode 12, the ferroelectric layer 13 and the semiconductor layer 14 in this order on the substrate 11 and then etching the layers and electrode into strips. Thereafter, a plurality of second electrodes 15 are formed on each of the stacked layers at the semiconductor layer 14 side.

Figure 13:
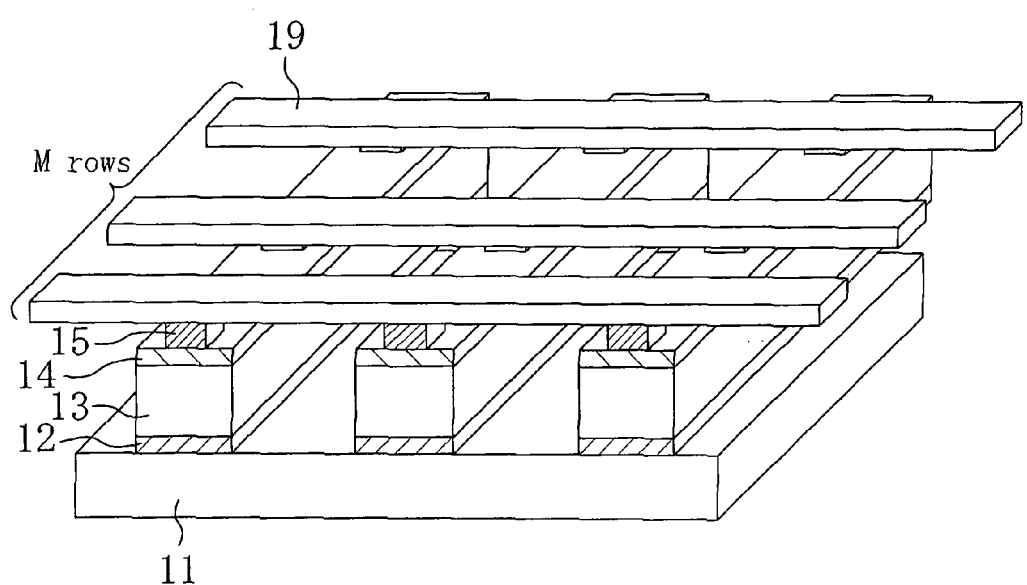
FIG. 13 is a cross-sectional perspective view illustrating a structure of the cross-point type memory of the present invention.

Next, as shown in FIG. 13, interconnects 19 (M rows) are formed along a row direction to connect the second electrodes 15, each being formed on each of the stacked layers at the semiconductor layer 14 side, with one another.

In the structure of FIG. 13, parts of each of the semiconductor layers 14 located in regions in which the semiconductor layer 14 intersects with the interconnects 19 serve as memory cells arranged in arrays. The plurality of semiconductor layers 14 arranged in the column direction form read column interconnects, and the plurality of interconnects 19 arranged in a row direction form row interconnects. Furthermore, the plurality of first electrodes 12 formed to extend in the column direction form write column interconnects.

Next, the operation of the cross-point type memory will be described with reference to FIGS. 14A and 14B.

Figure 14A:
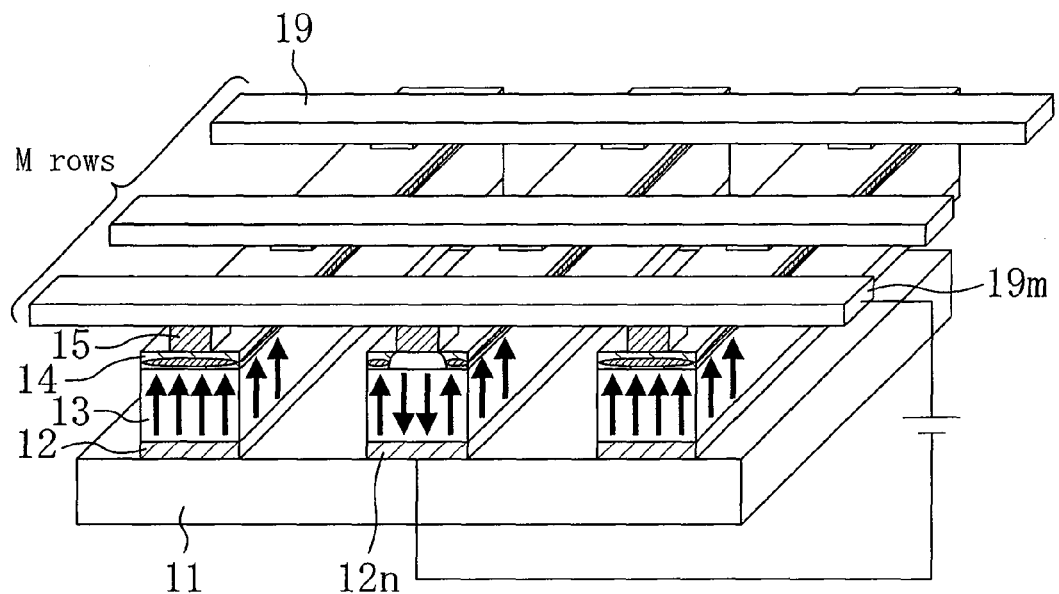
FIG. 14A is a cross-sectional perspective view illustrating a write operation of the cross-point type memory of the present invention.

First, in a write operation, as shown in FIG. 14A, a voltage is applied between a selected write column interconnect (first electrode) 12n and a selected row interconnect 19m to invert a polarization of part of the ferroelectric layer 13 located in a region in which the selected write column interconnect 12n intersects with the selected row interconnect 19m, thereby writing a first state (low resistance state) or a second state (high resistance state) in a memory cell (semiconductor layer 14).

For example, when information of "0" (high resistance state) is written in a memory cell, the potential of the row interconnect 19m is set to be high relative to the write column interconnect 12n to invert the direction of polarization in part of the ferroelectric layer 13 in a region in which the selected write column interconnect 12n intersects with the selected row interconnect 19m, thereby excluding electrons in the part of the semiconductor layer 14 located in the region in which the selected write column interconnect 12n intersects with the selected row interconnect 19m. Thus, the region is made to be a high resistance state. After that, even when a potential difference between the write column interconnect 12n and the row interconnect 19m is made 0, the polarization of the ferroelectric layer 13 is maintained. Hence, the written information is nonvolatile.

Figure 14B:
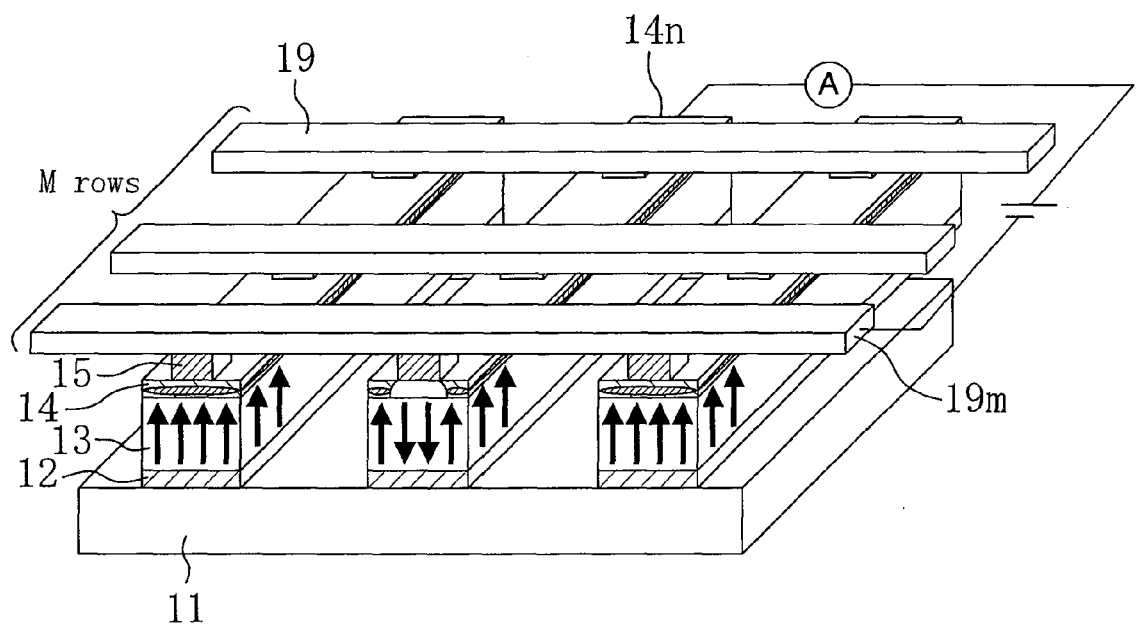
FIG. 14B is a cross-sectional perspective view illustrating a read operation of the cross-point type memory.

Next, in a read operation, as shown in FIG. 14B, a value of a current flowing between a selected read column interconnect (semiconductor layer) 14n and a selected row interconnect 19m is detected, thereby reading a first state (low resistance state) or a second state (high resistance state) held in a memory cell (semiconductor layer 14) located in a region in which the selected read column interconnect 14n intersects with the row interconnect 19m.

Specifically, a voltage which does not cause inversion of the polarization of part of the ferroelectric layer 13 located in the region in which the selected read column interconnect 14n intersects with the row interconnect 19m is applied between the selected read column interconnect 14n and the row interconnect 19m. Thus, information held in a memory cell can be read without being damaged.

When information "0" is written in a memory cell, for example, the semiconductor layer 14 is in a high resistance state. Therefore, a value of a current flowing between the selected read column interconnect 14n and the row interconnect 19m is several orders of magnitudes smaller, compared to the case where information "1" (low resistance state) is written in a memory cell. Thus, information written in the memory cell can be judged to be "0" or "1".

Note that as for currents flowing in the selected read column interconnect 14n, other currents than a current flowing in the part of the semiconductor layer 14 located in the region in which the selected read column interconnect 14n intersects with the row interconnect 19m flow in part (part (B) of FIG. 9B) of the semiconductor layer 14 located in a region other than regions in which the second electrodes 15 are formed.

In the structure of FIG. 12, the plurality of the second electrodes 15 are arranged along the center line of the strip shape semiconductor layer 14 in the length-wise direction (column direction) in the same manner as in FIGS. 9A and 9B. However, the arrangement of the second electrodes 15 is not limited thereto. For example, the arrangement shown in FIGS. 10A and 10B or the arrangement shown in FIGS. 11A and 11B may be adopted.

As described above, parts of the semiconductor layer 14 functioning as memory elements, specifically, parts of the semiconductor layer 14 located in the regions in which the second electrodes 15 are formed are arranged in arrays, thereby realizing array type memory cells connected with one another at each cross point. That is, cross-point connection of memory cells can be achieved in regions in which read column interconnects each being formed of the semiconductor layer 14 (or write column interconnects each being formed of the first electrode 12) intersect with the row interconnects 19 connected to the second electrodes 15, respectively. Thus, the size of memory cells can be reduced to 4 $F^2$, which can not be achieved in the known structure, so that a semiconductor memory device suitable for a high speed, large capacity memory with low power consumption can be realized.

Figure 15:
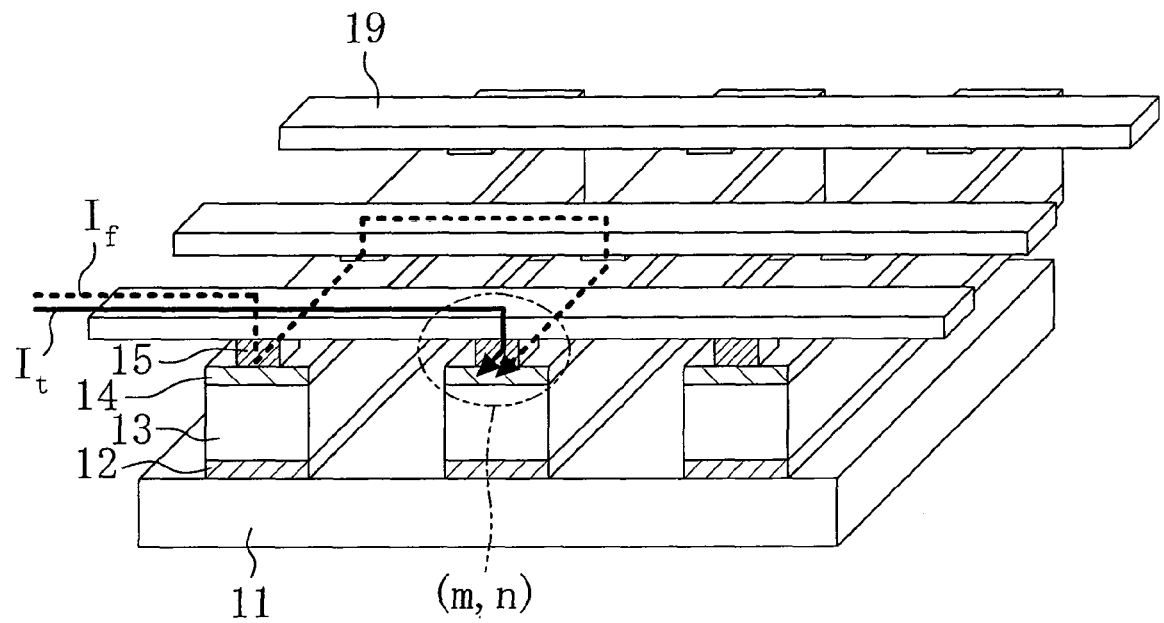
FIG. 15 is a cross-sectional perspective view illustrating a misread operation of the cross-point memory of the present invention.

In the above-described read operation, misreading of information in a non-selected cell might occur for the following reasons. That is, as shown in FIG. 15, when a memory cell located in a cross point (m, n) of an mth row and an nth column is selected, reading of information stored in the selected cell is performed by detecting a value of a current flowing through a path indicated by a solid line It in FIG. 15 from an associated one of the interconnects 19 to an associated on of the column interconnects (semiconductor layers) 14. However, when information "0" (high resistance state) is stored in the selected memory cell, a current might flow through a path If indicated by a broken line in FIG. 15, which is different from the read path It, i.e., via a plurality of non-selected cells in which information "1" (low resistance state) is stored. If a current flows through such a read path, information "1" stored in non-selected cells might be misread. That is, different information from information "0" that is desired to be read might be read.

Figure 16:
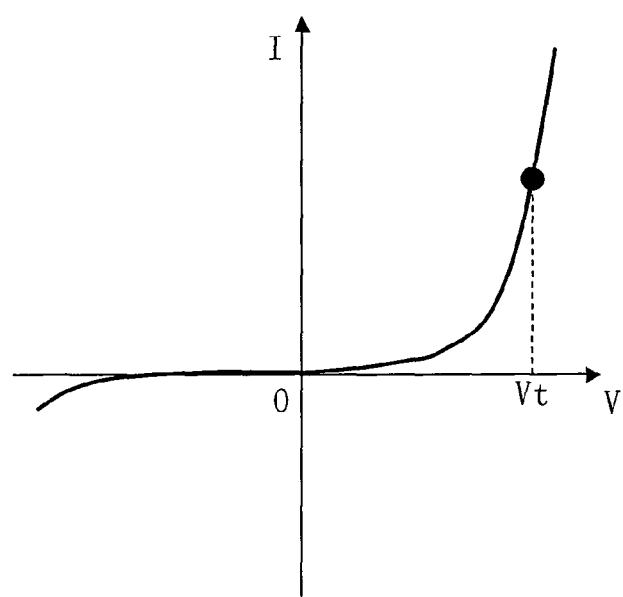
FIG. 16 is a graph showing characteristics of a non-linear rectifier used for preventing a misread operation according to the present invention.
Figure 17A:
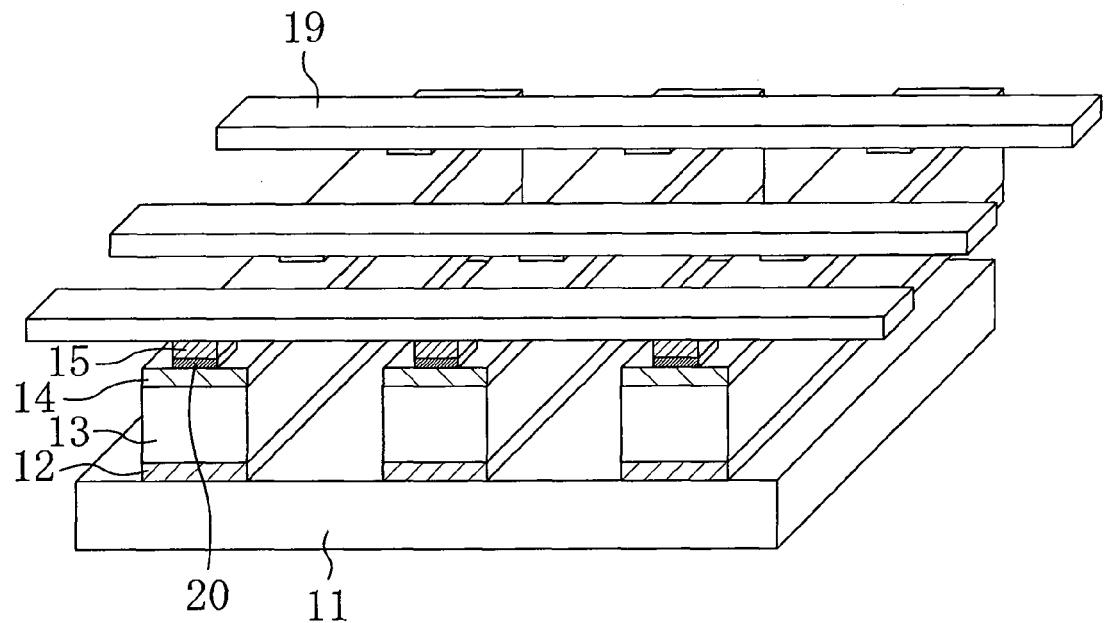
FIG. 17A is a cross-sectional perspective view illustrating a structure of the cross-point type memory for preventing a misread operation according to the present invention.
Figure 17B:
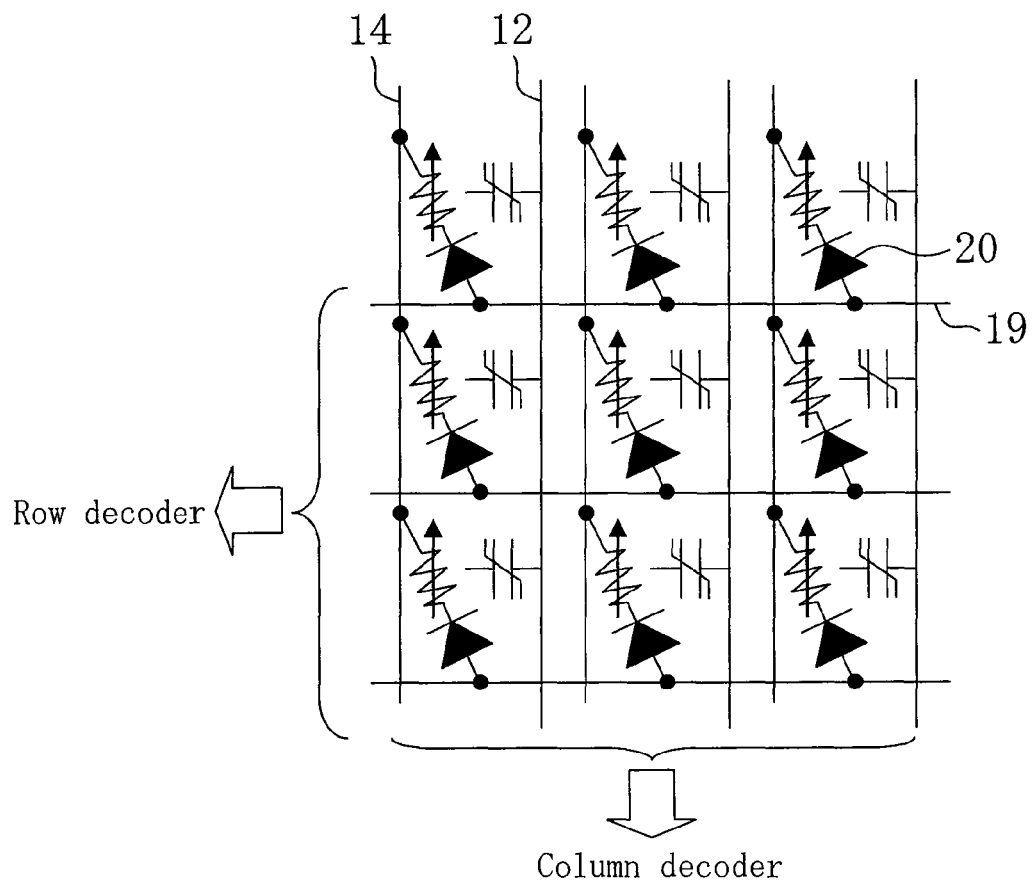
FIG. 17B is an equivalent circuit diagram of the structure.

To cope with such misreading, it is effective to provide a non-linear rectifier (diode), which exhibits the rectifying effect shown in FIG. 16, between each of the second electrodes 15 and the semiconductor layer 14. Specifically, as shown in FIG. 17A, a p-n diode 20 is provided in a connection section of each of the second electrodes 15 and the semiconductor layer 14. As another alternative, the second electrodes 15 which create a Schottky barrier to the semiconductor layer 14 may be used. In such a structure, if a voltage applied to a non-selected cell is equal to or lower than a threshold voltage Vt, a current hardly flows in non-selected cells, thereby preventing a current from flowing through a wrong read path. FIG. 17B is an equivalent circuit diagram illustrating the structure of FIG. 17A.

Note that the threshold voltage Vt is set, according to a voltage to be applied when a read operation is performed, so that a value of a current flowing in the diode becomes a predetermined value or less. Moreover, in FIG. 17A, the diode 20 is provided at the connection section of each of the second electrodes 15 and the semiconductor layer 14. However, the diode 20 may be provided at a connection section of each of the second electrodes 15 and an associated one of the row interconnects 19.

Next, a method for fabricating a semiconductor memory device according to the present invention will be described with reference to FIGS. 18A through 18D.

Figure 18A:
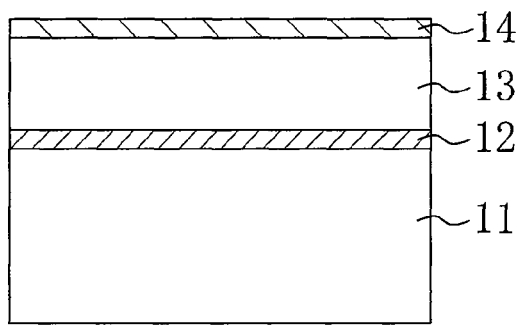
FIGS. 18A and 18D are cross-sectional views illustrating steps of a method for fabricating a semiconductor memory device according to the present invention.

First, as shown in FIG. 18A, using pulse laser deposition (PLD), with a substrate temperature of 700° C., a first electrode 12 is formed of strontium ruthenate (SrRuO$_3$: SRO) over a substrate 11, formed of Nb doped strontium titanate (SrTiO$_3$: STO) and cut out along a (100) plane, to have a thickness of 30 nm.

Next, after performing annealing at 700° C. in an oxygen atmosphere of 1 atm, using PLD with a substrate temperature of 700° C., a ferroelectric layer 13 is formed of lead zirconate titanate (PZT) to have a thickness of 450 nm. Note that a target sintered body of PLD has a composition of Pb:Zr:Ti=1:0.52: 0.48. Normally, the ferroelectric layer 13 having such a composition includes both tetragonal crystals and rhombohedral crystals existing together. However, according to this embodiment, the STO substrate 11 having a cubic crystal structure is used, and thus respective peaks of tetragonal crystals and rhombohedral crystals can not be separately observed by X-ray diffraction measurement. Hence, it is considered that the ferroelectric layer 13 is oriented along a <001> plane of tetragonal crystals. From observations of respective crystal orientations of planes of the STO substrate 11, the SRO film 12 and the PZT film 13, using electron backscatter diffraction (EBSD), a pole figure with four-fold symmetry in which orientations were all the same in the plane was obtained. Hence, the ferroelectric layer 13 is considered to be an excellent epitaxial film.

Next, in the same chamber of a PLD apparatus, with a substrate temperature of 400° C., a semiconductor layer 14 is formed of zinc oxide (ZnO) over the ferroelectric layer 13 so as to have a thickness of 30 nm. The ZnO film 14 formed in this manner is influenced by the orientation of the (001) plane of the PZT film 13 and is oriented along a <11-20> orientation. The crystal orientation is tilted by 90° from a c-axis orientation (<0001> orientation) having a polarity. This indicates that a non-polar plane is oriented. In observations of the structure using a cross section transmission electron microscope (cross section TEM), it was found that an interface was not distorted and respective crystal lattices of the PZT film 13 and the ZnO film 14 match each other. Furthermore, from an electron diffraction pattern, it was found that orientations in a plane of the PZT film 13, which was parallel to the substrate surface, were all <100>, and also orientations in a plane of the ZnO film 14, which was parallel to the substrate surface, were all <1-102>. That is, the ZnO film 14 formed in this manner was a film epitaxially grown on the PZT film 13.

Figure 18B:
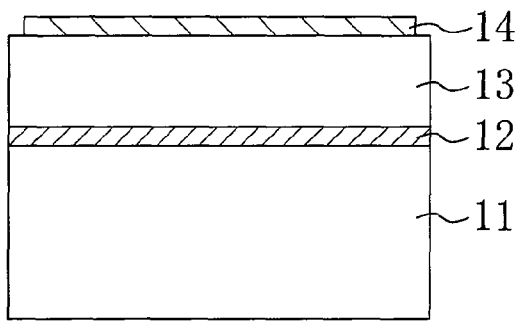

Next, as shown in FIG. 18B, part of the ZnO film 14 other than part thereof located in a device formation region is etched using a resist mask (not shown).

Figure 18C:
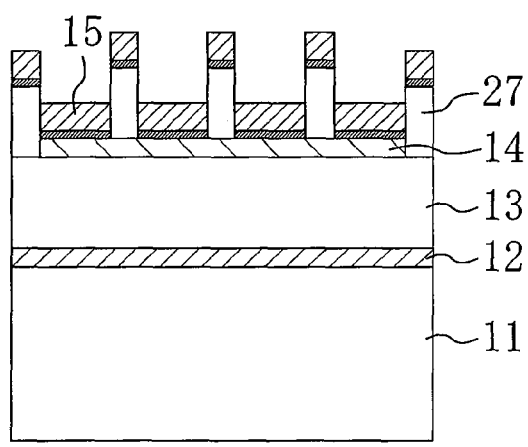
Figure 18D:
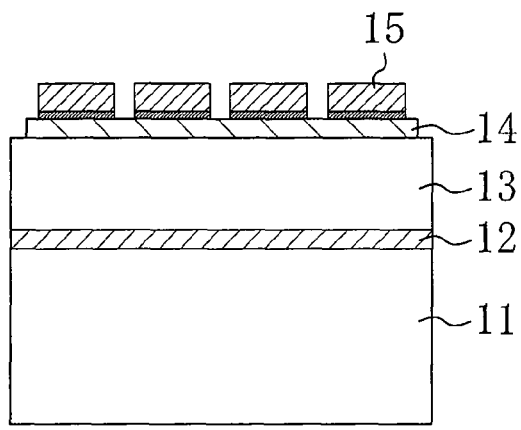

Next, as shown in FIG. 18C, a resist film 26 is patterned into a predetermined shape, and then, using electron beam deposition, a Ti film with a thickness of 30 nm and a Pt film with a thickness of 60 nm are formed. Thereafter, the resist film 26 is removed using a solvent, so that a plurality of second electrodes 15 of a Ti film and a Pt film are formed in predetermined locations.

To examine polarization characteristics of the PZT film formed in the same manner as that described above, electrodes including a Ti film and a Pt film were formed directly on a PZT film. As a result, a difference (2Pr) in remnant polarization value obtained by applying a voltage of ±10 V between the SRO film and each electrode was 59 $\mu C/cm_2$. In the vertical direction to a film surface, crystals of the PZT film were oriented along a <001> orientation, which was the polarization direction, and thus a large remnant polarization value was obtained.

Next, read characteristics of the semiconductor memory device of the present invention will be described with reference to FIGS. 19A, 19B and 19C and FIG. 20.

Figure 19A:
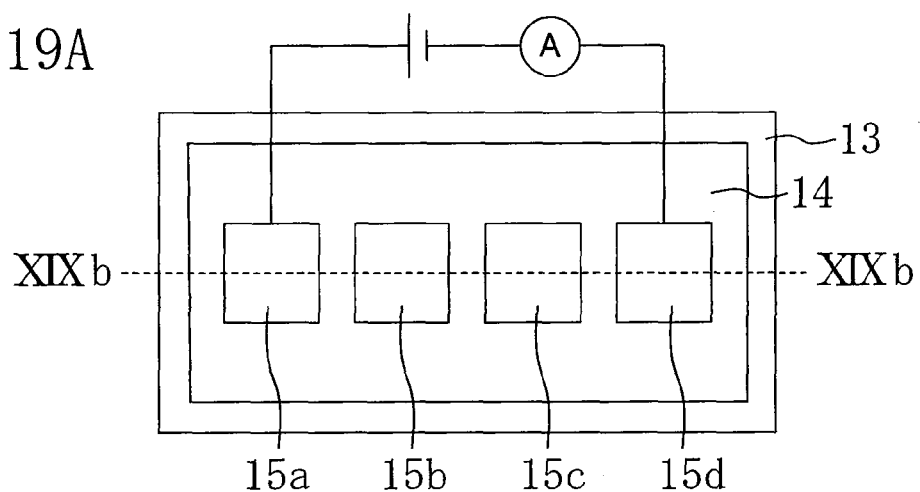
FIG. 19A is a plan view illustrating a structure of an evaluation sample for examining a conduction state between the semiconductor layer and the second electrodes according to the present invention.
Figure 19B:
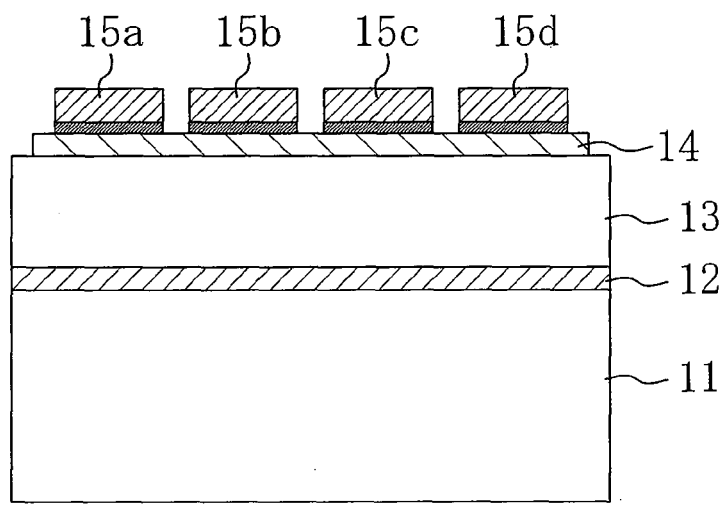
FIG. 19B is a cross-sectional view taken along the line XIXb-XIXb of FIG. 19B.
Figure 19C:
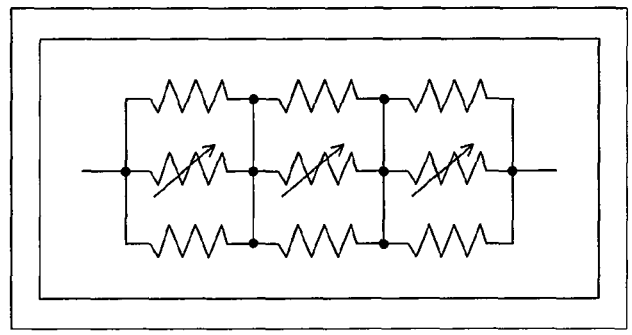
FIG. 19C is an equivalent circuit diagram of the structure.
Figure 20:
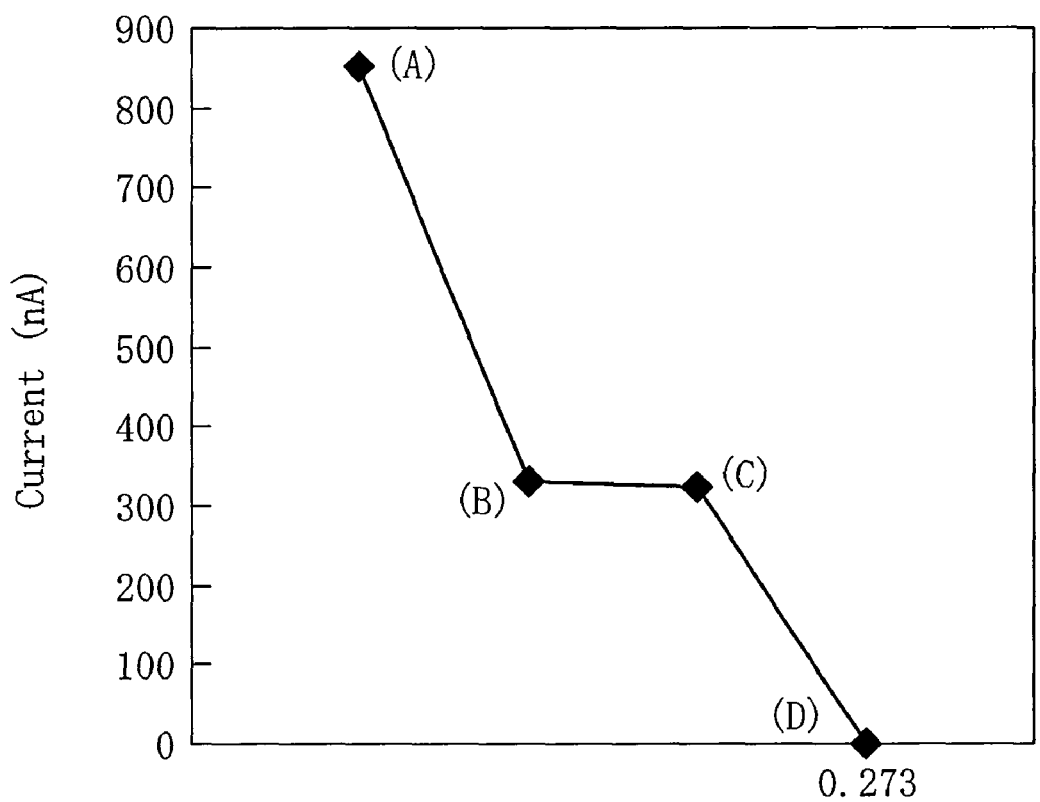
FIG. 20 is a graph showing read characteristics of the semiconductor memory device of the present invention.

FIGS. 19A, 19B and 19C are views illustrating a structure of an evaluation sample used for examination of the conduction state between the semiconductor layer 14 and each of the second electrodes 15a through 15d. FIG. 19A is a plan view. FIG. 19B is a cross-sectional view taken along the line XIXb-XIXb of FIG. 19A. FIG. 19C is an equivalent circuit diagram.

As shown in FIGS. 19A and 19B, a plurality of second electrodes 15a through 15d were formed on the semiconductor layer 14 and a current flowing between the second electrodes 15a and 15d was measured to examine the conduction state between the semiconductor layer 14 and each of the second electrodes 15a through 15d. Note that the second electrode 15d located at an edge portion of the semiconductor layer 14 was assumed as a common electrode (which will be hereafter referred to as a "COM electrode") for making a contact with the semiconductor layer 14.

First, a voltage of 10 V was applied to the first electrode 12 to have the second electrodes 15a through 15d all grounded, thereby setting the semiconductor layer 14 to be in an initial state, i.e., a low resistance state. At this time, as indicated by (A) in FIG. 20, a value of a current flowing between the second electrode 15a and the COM electrode (semiconductor layer 14) was 851 nA.

In this initial state, the first electrode 12 was grounded and a voltage of 10 V was applied to the second electrode 15a, so that only part of the semiconductor layer 14 located under the second electrode 15a was depleted. At this time, as indicated by (D) of FIG. 20, a value of a current flowing between the second electrode 15a and the COM electrode was 0.273 nA.

That is, as for a conduction state between the semiconductor layer 14 and each of the second electrodes 15a through 15d, a current value differs by three orders of magnitudes or more between when the part of the semiconductor layer 14 located under the second electrode 15a is in a low resistance state and when the part is in a high resistance state. Thus, information (a low resistance state or a high resistance state) held in the part (corresponding to a selected cell) of the semiconductor layer 14 located under the second electrode 15a can be judged in a simple manner according to a value of a current flowing between the semiconductor layer 14 and the second electrode 15a.

A value of a current flowing between the second electrode 15a and the COM electrode when only the part of the semiconductor layer 14 located under the second electrode 15b was depleted in the same manner as described above was, as indicated by (B) of FIG. 20, 332 nA. Also, a value of a current flowing between the second electrode 15a and the COM electrode when only the part of the semiconductor layer 14 located under the second electrode 15c was depleted in the same manner as described above was, as indicated by (C) of FIG. 20, 325 nA.

That is, even when the part (corresponding to a selected cell) of the semiconductor layer 14 located under the second electrode 15b or 15c is in a high resistance state, a current path via part (in a low resistance state) of the semiconductor layer 14 located in a region other than the regions in which the second electrodes 15a, 15b and 15c are formed is ensured between the second electrode 15a and the COM electrode. Therefore, information held in the part (a selected cell) of the semiconductor layer 14 located under the second electrode 15a can be read without being influenced by information held in the parts (non-selected cells) of the semiconductor layer 14 located under the second electrodes 15b and 15c.

According to the method, shown in FIGS. 18A through 18D, for fabricating a semiconductor memory device according to the present invention, an NSTO substrate is used as the substrate 11. However, even when a silicon (Si) substrate is used, a semiconductor memory device according to the present invention can be fabricated. Hereafter, description will be made with reference to FIG. 21 and FIG. 22.

Figure 21:
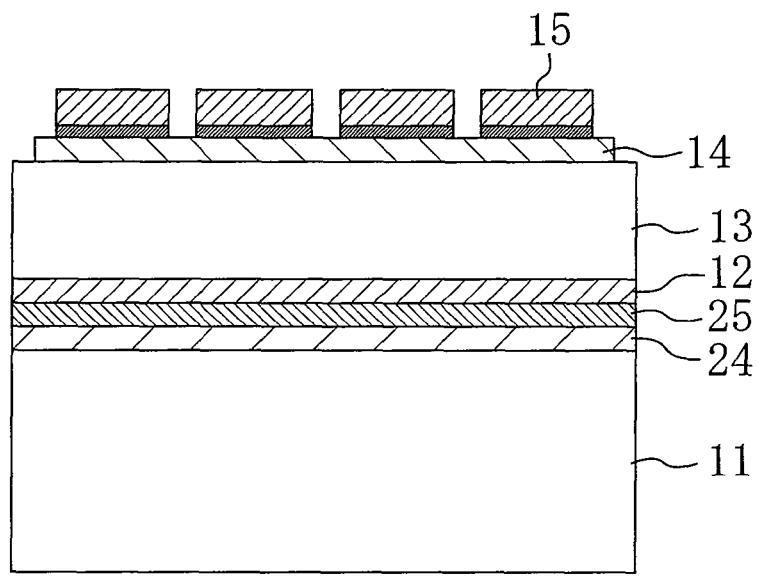
FIG. 21 is a cross-sectional view illustrating another structure of the semiconductor memory device of the present invention.

FIG. 21 is a view schematically illustrating a structure of a semiconductor memory device using a Si substrate 11 cut along a (100) plane. After hydrogen termination process is performed, using hydrogen fluoride, to the Si substrate 11 which has been RCA cleansed, using PLD, as a buffer layer, a yttria-stabilized zirconia (YSZ) film 24 is deposited on the Si substrate 11 to a thickness of 30 nm and then cerium oxide ($CeO_2$) film 25 is deposited thereon to a thickness of 30 nm. Note that an oxygen partial pressure during deposition of the YSZ film 24 is preferably a low oxygen partial pressure ($3 \times 10^{-5}$ Torr) particularly in an initial stage of growing to prevent oxidation of an interface with silicon as much as possible.

Next, a first electrode 12 of a SRO film with a thickness of 30 nm, a ferroelectric layer 13 of a PZT film with a thickness of 450 nm and a semiconductor layer 14 of a ZnO film with a thickness of 30 mm are stacked on the buffer layer.

In this case, each of the layers from the Si substrate 11 to the PZT film 13 is a film epitaxially grown along a (100) orientation. Crystallinity of the PZT film 13 is not inferior, compared to the case where a STO substrate is used, and about the same flatness can be obtained. The crystal orientation of the ZnO film 14 is controlled to <11-20> and, thus, a non-polar orientation is achieved. Finally, a plurality of second electrodes 15 are formed of a Ti layer with a thickness of 30 nm and a Pt layer with a thickness of 60 nm on the ZnO film 14.

As has been described, even when a NSTO substrate which is expensive and is limited to a small diameter is not used but an inexpensive Si substrate is used, a semiconductor memory device including the ferroelectric layer 13 and the semiconductor layer 14, both obtained by epitaxial growth, can be fabricated.

Figure 22:
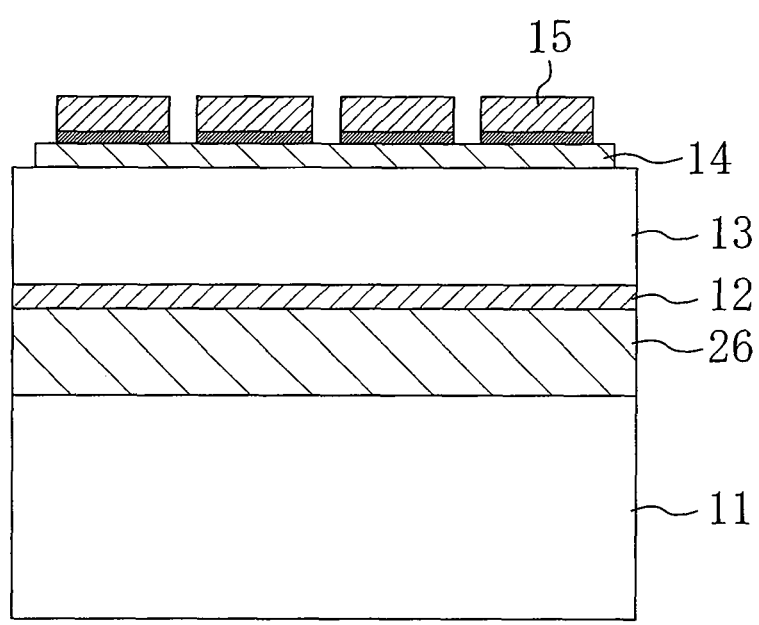
FIG. 22 is a cross-sectional view illustrating still another structure of the semiconductor memory device of the present invention.

FIG. 22 is a view schematically illustrating a structure of a semiconductor memory device fabricated using a Si substrate as the substrate 11 and bismuth titanate ($Bi_4Ti_3O_{12}$: BIT) as the ferroelectric layer 13.

A silicon dioxide ($SiO_2$) film 26 is formed on the Si substrate 11 using normal pressure CVD and, furthermore, a first electrode 12 of a Pt film is formed using sputtering. In this case, the $SiO_2$ film 26 is amorphous and the Pt film 12 is oriented along a (111) orientation.

Next, using MOCVD, with a substrate temperature of 450° C., a BIT film 13 is formed on the Pt film 12 so as to have a thickness of 100 nm. A source used in this case is obtained by dissolving solid Bi-alkoxide and solid Ti-alkoxide in ethylcyclohexane and evaporating the resultant solution. The source flow ratio between Bi and Ti is preferably set to be within a range which forms Bi richer composition by about 10%, compared to stoichiometric ratio between Bi and Ti. Argon as a carrier gas is added to the source, the source is introduced into a film forming chamber, and then oxygen as a reaction gas is introduced therein. After forming a BIT film 13, a substrate is exposed to a halogen lamp for one minute in the atmosphere, thereby performing rapid heating at 500° C. to the substrate. The BIT film 13 formed under the above-described condition has a state in which grains oriented mainly along a (110) orientation and a (111) orientation are present, and has a very smooth surface with an average square roughness is 3 nm or less. Furthermore, after the rapid heating, the BTI film 13 is polished to a depth of about 50 nm from its surface by chemical mechanical polishing (CMP) to reduce the thickness of the BIT film 13. Accordingly, a very smooth surface having an average square roughness of 1 nm or less can be achieved at the surface of the BIT film 13.

Thereafter, using an PLD apparatus, with a substrate temperature of 400° C., a semiconductor layer 14 of ZnO film is formed on the BIT film 13 so as to have a thickness of 30 nm, and then, a plurality of second electrodes 15 of a Ti layer with a thickness of 30 nm and a Pt layer with a thickness of 60 nm are formed on the ZnO film 14.

As described above, even when a NSTO substrate which is expensive and is limited to a small diameter is not used but an inexpensive Si substrate is used, the BIT film 13 having a surface smoothness equivalent to that of an epitaxially grown ferroelectric film can be obtained. Furthermore, the BIT film 13 has a (111) orientation and a (100) orientation and, the (111) orientation and the (100) orientation can stably exhibit high polarizations, i.e., 70% and the 71%, respectively, with respect to the highest remnant polarization with the (100) orientation. Accordingly, a current flowing in the semiconductor layer 14 can be largely changed when the semiconductor layer 14 is in a accumulation/depletion state, so that a stable read operation can be performed. Note that more grains exhibiting such high polarization are generated, as grains exist in a larger area of the surface of the BIT film 13. Therefore, it is preferable that grains exhibiting a remnant polarization of 70% or more, with respect to the plane orientation exhibiting the highest remnant polarization, accounts for 50% or more of the BIT film 13. The BIT film 13 formed in the above-described manner satisfies this condition.

The present invention has been described with reference to preferred embodiments of the present invention. However, the present invention is not limited to the above-described embodiment and various modifications are possible. For example, in the above-described embodiment, a NSTO substrate or a Si substrate is used, but the present invention is not limited thereto. For example, a substrate of sapphire, lanthanum aluminum ($LaAlO_3$) or the like can be used. As a material for the ferroelectric layer 13, besides PZT and BIT, for example, $SrBi_2Ta_2O_9$, $Bi_{4-x}La_xTi_3O_{12}$ or the like can be used. As a material for the semiconductor layer 14, besides ZnO, for example, a transparent material such as $WO_3$, ITO (InO—SnO), IGZO ($InGaO_3(ZnO)_5$), GaN, AlGaN, InN, SiC, STO, LSCO($La_{2-x}Sr_xCuO_4$), LCMO ($La_{1-x}Ca_xMnO_3$), PCMO ($Pr_{1-x}Ca_xMnO_3$) or the like, a superconducting material, or a material undergoing Mott transition can be used. As a material for the first electrode 12 and the second electrodes 15, besides a metal material such as Ti, Pt and the like, ITO, ZITO (Zn—In—Sn—O) or the like can be used.

In the above-described embodiment, the semiconductor memory device has a structure in which the first electrode 12, the ferroelectric layer 13, the semiconductor layer 14, and a plurality of second electrodes 15 are stacked in this order on the substrate 11. However, the semiconductor memory device may be formed to have a structure having a reversed stacking order. That is, the plurality of the second electrodes 15, the semiconductor layer 14, the ferroelectric layer 13 and the first electrode 12 may be stacked in this order on the substrate 11.

Figure 23:
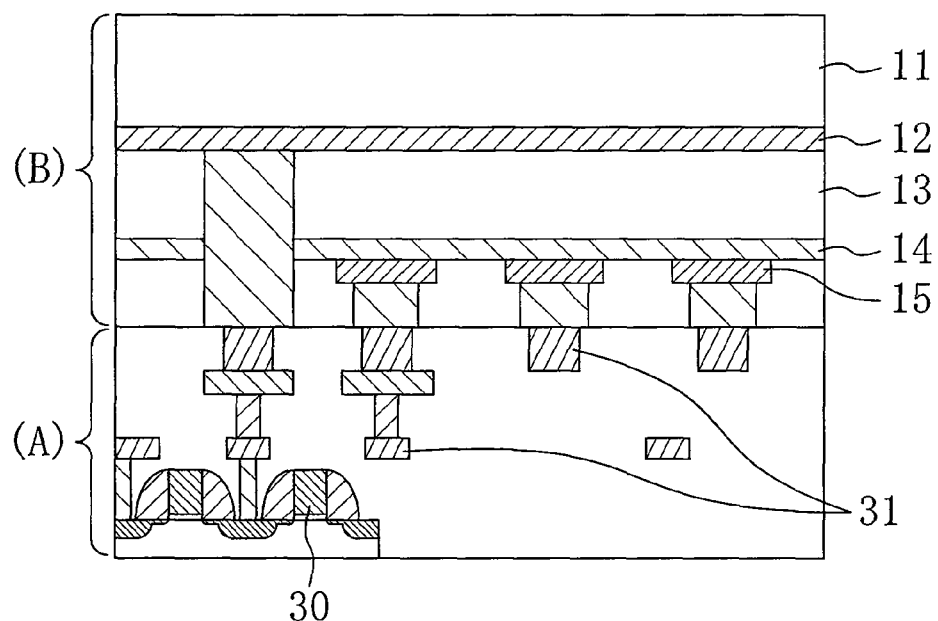
FIG. 23 is a cross-sectional view illustrating still another structure of the semiconductor memory device of the present invention.

With the above-described structure, for example, as shown in FIG. 23, when a semiconductor memory device (B) according to the present invention is stacked on a CMOS substrate (A) on which a logic circuit including MOS transistors 30 and the like are formed, interconnects 31 of a memory circuit formed on the CMOS substrate (A) can be connected to second electrodes 15 in a simple manner. Thus, reduction in size of a semiconductor integrated circuit on which memory functions are mounted together becomes possible.

Figure 24:
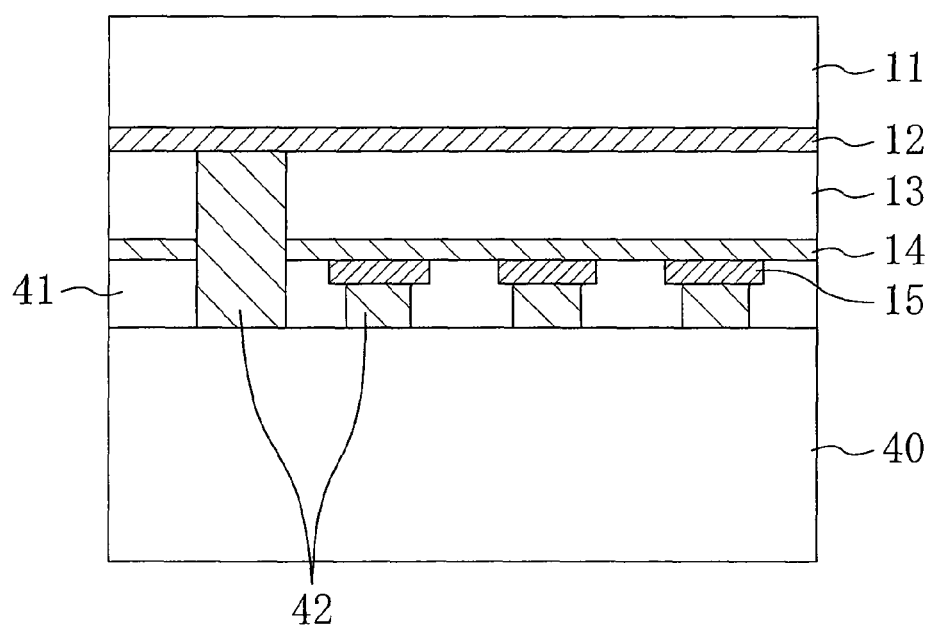
FIG. 24 is a cross-sectional view illustrating still another structure of the semiconductor memory device of the present invention.

Moreover, as shown in FIG. 24, it is possible to mount the semiconductor memory device on a heterogeneous substrate 40. In that case, there is no need to carefully select an underlying substrate.

Figure 25A:
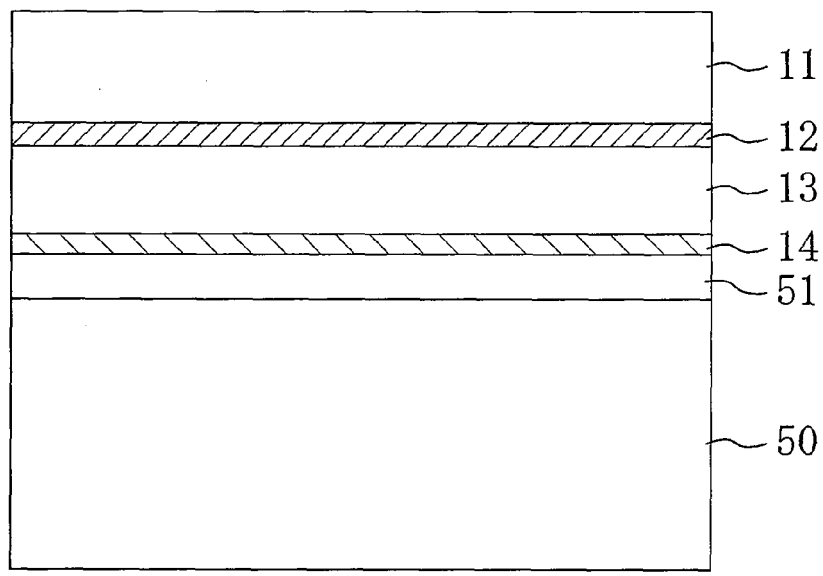
FIGS. 25A and 25B are cross-sectional views illustrating still another structure of the semiconductor memory device of the present invention.
Figure 25B:
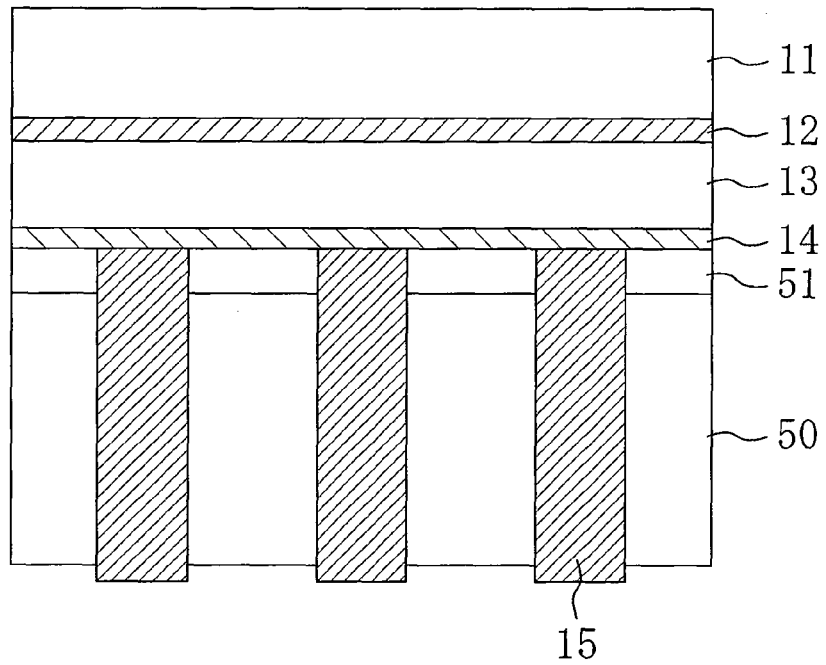
Figure 27A:
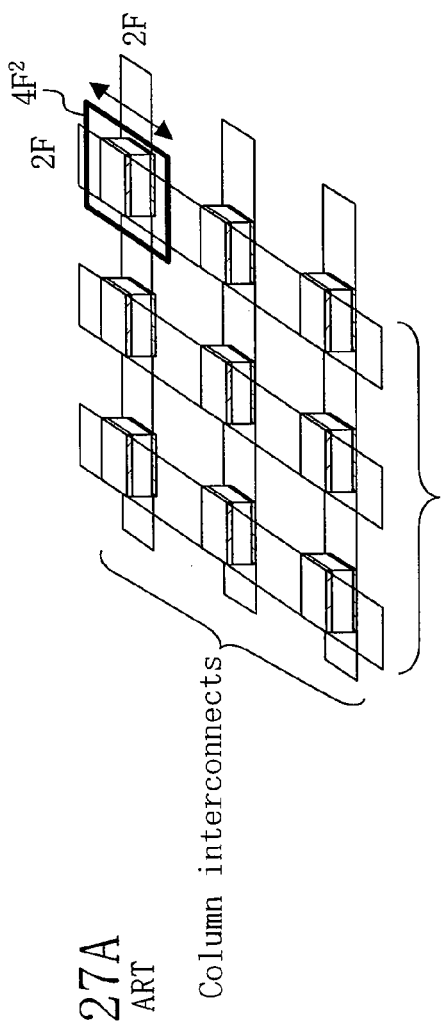
FIG. 27A is an illustration of a structure of a known cross-point type memory.
Figure 27B:
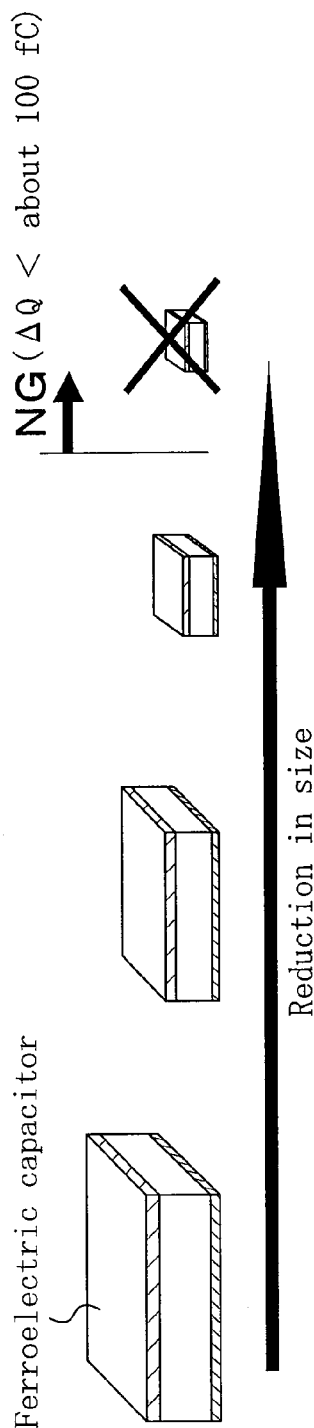
FIG. 27B is an illustration describing size reduction of a ferroelectric capacitor.
Figure 27C:
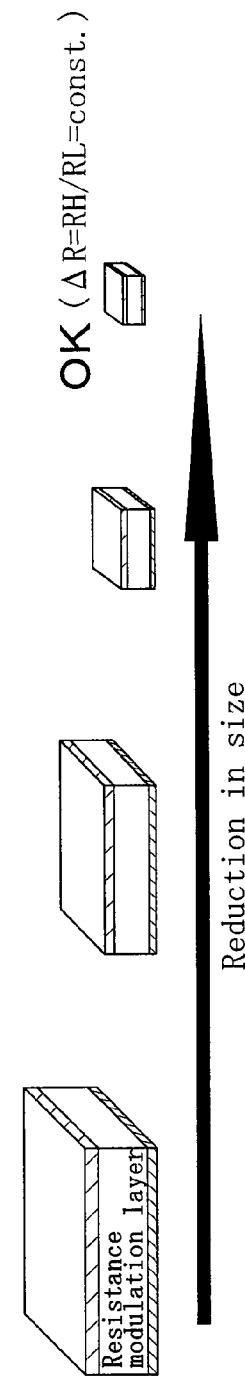
FIG. 27C is an illustration describing size reduction of a resistance modulation element.

As shown in FIG. 25A, a semiconductor layer (for example, ZnO with 30 nm) 13 is formed on a single crystalline substrate (for example, a sapphire substrate) 50 by epitaxial growth with a buffer layer (for example, ZnO with 1 μm/ZnMgO with 30 nm) 51 interposed therebetween. Accordingly, a high quality semiconductor layer 14 can be obtained and characteristics of a resistance modulation section can be improved. Note that second electrodes 15 can be formed so that each of the second electrodes 15 passes through the substrate 50.

In the above-described embodiment, each of regions (A) of the semiconductor layer 14 located on which the second electrodes 15 are formed is made to function as a memory element having two resistance states. Each of the regions (A) can be made also to function as a switching element holding an ON/OFF state. Specifically, with reference to FIG. 14B again, by applying a voltage between a selected column interconnect (semiconductor layer) 14n and a selected row interconnect 19m, a current flowing between the column interconnect 14n and the row interconnect 19m can be controlled, based on an ON/OFF state of part (switching element) of the semiconductor layer 14 located in a region where the column interconnect 14n intersects with the row interconnect 19m. As described above, a switching element is made to function as a cross-over switch connected at a cross point at which the column interconnect 14 intersects with the row interconnect 19 and thereby a random access semiconductor switching device including switching elements having a reduced cell size of 4 $F^2$ can be realized. For example, currently, a connection switch between interconnects in a FPGA (full programmable logic gate array) includes a static random access memory (SRAM) and a pass transistor and, in general, has a cell size of about 120 $F^2$. However, if the semiconductor switching device of the present invention is used, the cell size of the connection switch can be reduced to 4 $F^2$.

What is claimed is:

1. A semiconductor memory device comprising:
    a stacked-layer film formed of a ferroelectric layer and a semiconductor layer;
    a first electrode formed on the ferroelectric layer of the stacked-layer film; and
    a plurality of second electrodes formed on the semiconductor layer of the stacked-layer film,
    wherein each of parts (A) of the semiconductor layer located in regions in which the second electrodes are formed, respectively, holds one of a first state in which majority carriers in the semiconductor layer are coupled with polarization charges in the ferroelectric layer and thereby a low resistance state is achieved and a second state in which minority carriers in the semiconductor layer are coupled with polarization charges in the ferroelectric layer and thereby a high resistance state is achieved, and
    part (B) of the semiconductor layer located in a region other than the regions in which the second electrodes are formed, respectively, holds a low resistance state in which majority carriers in the semiconductor layer are coupled with polarization charges in the ferroelectric layer.

2. The semiconductor memory device of claim 1, wherein a value of a current flowing between each of the part (B) of the semiconductor layer and each of the second electrodes is detected, thereby reading the first state or the second state held in each of the parts (A) of the semiconductor layer.

3. The semiconductor memory device of claim 1, wherein a voltage is applied between the first electrode and each of the second electrodes to invert a polarization of part of the ferroelectric layer located in a region in which the second electrode is formed, thereby writing the first state or the second state in an associated one of the parts (A) of the semiconductor layer.

4. The semiconductor memory device of claim 1, wherein the first state is a state in which, in the parts (A) of the semiconductor layer, the majority carriers in the semiconductor layer are in an accumulation state.

5. The semiconductor memory device of claim 4, wherein the majority carriers in the semiconductor layer are accumulated in part of the semiconductor layer located around an interface with the ferroelectric layer.

6. The semiconductor memory device of claim 5, wherein the majority carriers in the semiconductor layer are made of two-dimensional carrier gas.

7. The semiconductor memory device of claim 1, wherein the second state is a state in which, in the parts (A) of the semiconductor layer, the semiconductor layer is in a depletion state.

8. The semiconductor memory device of claim 1, wherein a number of the large number carriers contained in the semiconductor layer per unit area is smaller than a number of the polarization charges per unit area, induced in part of the ferroelectric layer located around an interface with the semiconductor layer.

9. The semiconductor memory device of claim 1, wherein the semiconductor layer is formed so as to have a strip shape,
    the second electrodes are arranged along a longitudinal direction of the semiconductor layer having a strip shape, and
    the semiconductor layer has a larger width than a width of each of the second electrodes.

10. The semiconductor memory device of claim 9, wherein the second electrodes are arranged at regular intervals along a center line of the semiconductor layer having a strip shape.

11. The semiconductor memory device of claim 1, wherein the first electrode is formed on a substrate, and
    the stacked-layer film is formed of the ferroelectric layer formed on the first electrode and the semiconductor layer formed on the ferroelectric layer.

12. The semiconductor memory device of claim 1, wherein the semiconductor layer is formed of ZnO.

13. The semiconductor memory device of claim 1, wherein the ferroelectric layer is formed of PZT.

14. The semiconductor memory device of claim 1, wherein the stacked-layer film is provided plural in number so that each of the stacked-layer films has a strip shape and is arranged on a substrate so as to extend along a column direction,
    the second electrodes formed on the semiconductor layer of each of the stacked-layer films are connected to a plurality of interconnects which are arranged on the substrate so as to extend along a row direction, and
    the parts (A) of the semiconductor layers each of which is located at a region in which each of the semiconductor layers intersects with an associated one of the interconnects function as memory cells arranged in arrays.

15. The semiconductor memory device of claim 14, wherein the plurality of semiconductor layers arranged so as to extend along the column direction form column interconnects,
    the plurality of interconnects arranged so as to extend along the row direction form row interconnects, and
    a value of a current flowing between selected one as a read column interconnect from the plurality of interconnects and selected one from the row interconnects is detected, thereby reading the first state or the second state held in one of the memory cells located in a region in which the selected read column interconnect intersects with the selected row interconnect.

16. The semiconductor memory device of claim 15, wherein a voltage with which a polarization of part of the ferroelectric layer located in the region in which the selected read column interconnect intersects with the selected row interconnect is not inverted is applied between the selected read column interconnect and the selected row interconnect, thereby reading the first state or the second state held in said one of the memory cells.

17. The semiconductor memory device of claim 15, wherein a current detected in a reading operation flows in the part (B) of one of the semiconductor layers forming the selected read column interconnect.

18. The semiconductor memory device of claim 14, wherein the first electrode formed on the ferroelectric layer is provided plural in number so that each of the first electrodes has a strip shape, and the first electrodes form write column interconnects which are arranged on the substrate so as to extend along a column direction, and a voltage is applied between selected one of the write column interconnects and the selected row interconnect to invert a polarization of part of the ferroelectric layer located in a region in which the selected write column interconnect intersects with the selected row interconnect, thereby writing the first state or the second state in said one of the memory cells.

19. The semiconductor memory device of claim 14, wherein in a memory cell section, a non-linear rectifier is formed between each of the parts (A) of the semiconductor layers and an associated one of the second electrodes or between each of the second electrodes and an associated one of the row interconnects.

20. A method for fabricating the semiconductor memory device of claim 1, the method comprising the steps of:

forming a first electrode on a substrate;

forming a stacked-layer film of a ferroelectric layer and a semiconductor layer on the first electrode;

forming a plurality of second electrodes on the semiconductor layer; and applying a voltage with which a plurality of carriers in the semiconductor layer are coupled with polarization charges in the ferroelectric layer between the first electrode and each of the plurality of the second electrodes, and thereby making entire part of the semiconductor layer be in a low resistance state.

21. A semiconductor switching device comprising:

a stacked-layer film formed of a ferroelectric layer and a semiconductor layer;

a first electrode formed on the ferroelectric layer of the stacked-layer film; and a plurality of second electrodes formed on the semiconductor layer of the stacked-layer film;

wherein each of parts (A) of the semiconductor layer located in regions in which the second electrodes are formed, respectively, holds one of an ON state in which majority carriers in the semiconductor layer are coupled with polarization charges in the ferroelectric layer and thereby a low resistance state is achieved, and an OFF state in which minority carriers in the semiconductor layer are coupled with polarization charges in the ferroelectric layer and thereby a high resistance state is achieved, and part (B) of the semiconductor layer located in a region other than the regions in which the second electrodes are formed, respectively, holds a low resistance state in which majority carriers in the semiconductor layer are coupled with polarization charges in the ferroelectric layer.

22. The semiconductor switching device of claim 21, wherein the stacked-layer film is provided plural in number so that each of the stacked-layer films has a strip shape and is arranged on a substrate so as to extend along a column direction, the second electrodes formed on the semiconductor layer of each of the stacked-layer films are connected to a plurality of interconnects which are arranged on the substrate so as to extend along a row direction, and the parts (A) of the semiconductor layers each of which is located at a region in which each of the semiconductor layers intersects with an associated one of the interconnects function as a switching elements arranged in arrays.

23. The semiconductor switching device of claim 22, wherein the plurality of semiconductor layers arranged so as to extend along a column direction form column interconnects, the plurality of interconnects arranged so as to extend in a row direction form row interconnects, and a voltage is applied between selected one of the column interconnects and selected one of the row interconnects, thereby controlling ON/OFF of one of the switching elements located in a region in which the selected column interconnect intersects with the selected row interconnect.

* * * * *